(12) United States Patent
Yamada et al.

(10) Patent No.: US 7,696,099 B2
(45) Date of Patent: Apr. 13, 2010

(54) MANUFACTURING METHOD OF SEMICONDUCTOR DEVICE

(75) Inventors: Masaru Yamada, Toyama (JP); Akihiko Tsudumitani, Kyoto (JP)

(73) Assignee: Panasonic Corporation, Osaka (JP)

( * ) Notice: Subject to any disclaimer, the term of this patent is extended or adjusted under 35 U.S.C. 154(b) by 555 days.

(21) Appl. No.: 11/600,068

(22) Filed: Nov. 16, 2006

(65) Prior Publication Data
US 2007/0196965 A1 Aug. 23, 2007

(30) Foreign Application Priority Data
Nov. 21, 2005 (JP) .............................. 2005-335782

(51) Int. Cl.
*H01L 21/302* (2006.01)
(52) U.S. Cl. .................. 438/713; 438/689; 438/700; 257/E21.219
(58) Field of Classification Search .................. 438/689, 438/700, 713, 738; 257/E21.219, E21.244, 257/E21.246
See application file for complete search history.

(56) References Cited
U.S. PATENT DOCUMENTS
6,287,974 B1  9/2001 Miller
6,426,300 B2 *  7/2002 Park et al. .................... 438/700
* cited by examiner

*Primary Examiner*—Asok K Sarkar
*Assistant Examiner*—Julia Slutsker
(74) *Attorney, Agent, or Firm*—McDermott Will & Emery LLP

(57) ABSTRACT

A first film and a second film are formed on a semiconductor substrate in this order. A resist pattern is formed on the second film. An opening is formed by removing the second film exposed between the resist pattern at a state where the second film remains on the bottom. A first removal preventing film is formed on the side wall of the opening and the residual film is removed at a state where the projecting part of the second film protruding from the sidewall to the opening remains. The first film exposed in the opening is removed. A second removal preventing film is formed on the first removal preventing film and the surface of the semiconductor substrate exposed in the opening is removed at a state where the projecting part of the semiconductor substrate protruding from the side wall to the opening remains and a round part is formed at the projecting part of the semiconductor substrate. The semiconductor substrate exposed in the opening is further removed.

7 Claims, 24 Drawing Sheets

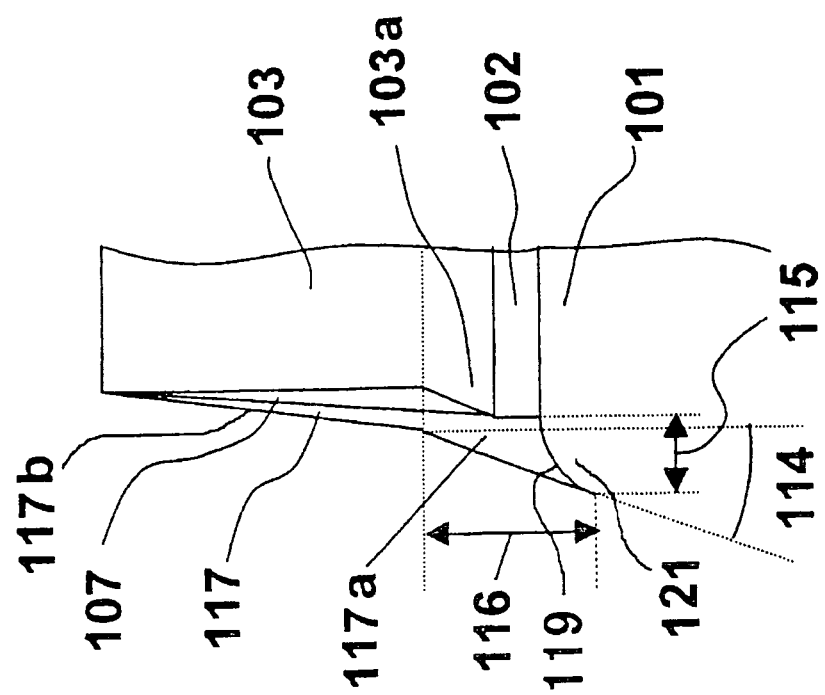
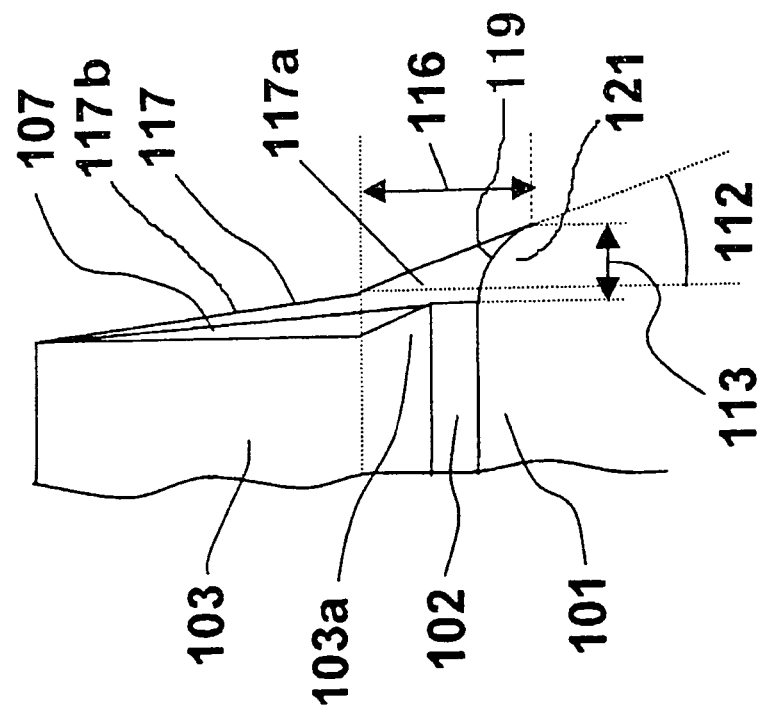
FIG. 8A
FIG. 8B

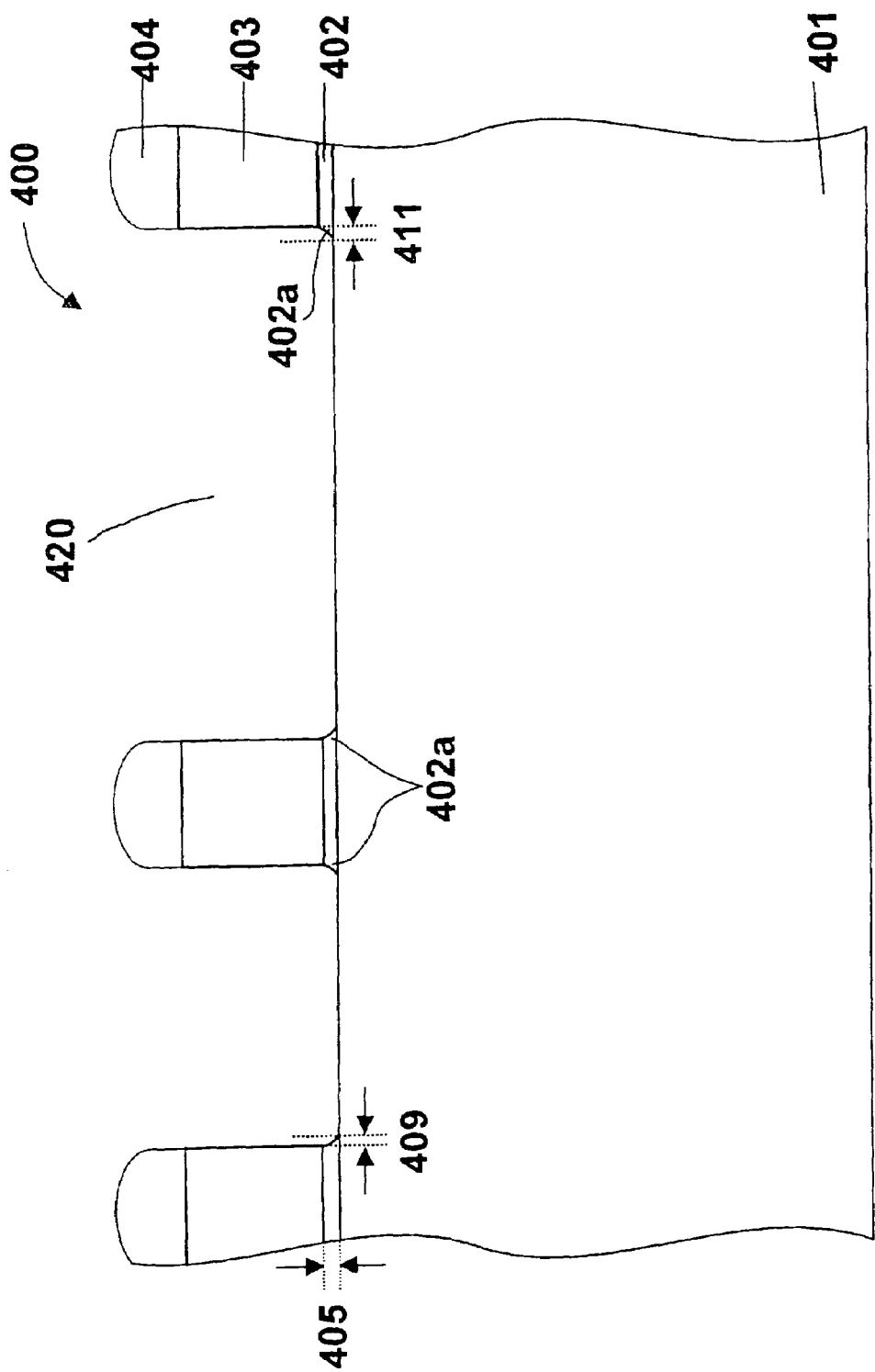

MANUFACTURING METHOD OF SEMICONDUCTOR DEVICE

BACKGROUND OF THE INVENTION

1. Field of the Invention

The present invention relates to a manufacturing method of a semiconductor device and more particularly, to a method of forming a trench isolation for isolating elements.

2. Description of the Related Art

Based on miniaturization of the semiconductor device, a shallow trench isolation (referred to as the STI hereinafter) in which a shallow trench is formed to bury an insulation film for element isolation has been widely used as a method of electrically isolating elements of sub-quarter micron devices. A conventional manufacturing method of a semiconductor device disclosed in U.S. Pat. No. 6,287,974 where shallow trench isolation is implemented will be described with reference to FIGS. 21 and 22.

In FIGS. 21 and 22, the semiconductor device includes a chamber atmosphere 500, a silicon substrate 501, a silicon oxide film 502, a silicon nitride film 503, a resist pattern 504, the thickness of the silicon oxide film 505, a silicon shoulder round part 506, and a removal preventing film 507.

The STI is formed by trench etching the silicon substrate 501. At this time, an active region of the silicon substrate 501 is etched away under such a condition that a removal preventing film (C-group deposition) 507 is formed on the side wall of a hard mask (the silicon oxide film 502 and the silicon nitride film 503). According to this, the removal preventing film 507 is formed so as to round the active region shoulder part 506. Hereinafter, the portion of the active region shoulder part protruding from the hard mask along the lateral direction of the substrate is referred to as the projecting part, and the rounded portion of the projection part is referred to as the round part. The above etching condition is determined by selecting the kind of etching gas, a gas flow rate and the like. The round part of the active region shoulder part 506 formed as described above plays an important role in reducing an electric field concentration to a gate insulation film. The shape of the round part of the active region shoulder part 506 is controlled by the amount of the removal preventing film 507 formed.

FIG. 23 shows a sectional observation image by a scanning electron microscope (SEM) at this time. FIG. 24 is a schematic view showing the SEM image in FIG. 23. In FIG. 24, a representative example of a pattern in which active regions are crowded, is described on the left side and a representative example of a pattern in which active regions are relatively isolated, is described on the right side. In below description, the part to which a term "crowding" is appended means the part in which the active regions are crowded and the part to which a term "isolated" is appended means the part in which the active regions are isolated. In FIG. 24, numeral 600 denotes a chamber atmosphere, numeral 601 denotes a silicon substrate, numeral 602 denotes a silicon oxide film, numeral 603 denotes a silicon nitride film, numeral 604 denotes a resist, numeral 605 denotes the thickness of the silicon oxide film, numeral 606 denotes a silicon shoulder round part (crowding), numeral 606' denotes a silicon shoulder round part (isolated), numeral 607 denotes a removal preventing film, numeral 608 denotes a taper angle of the removal preventing film (crowding), numeral 609 denotes a projection part of the silicon substrate (crowding), numeral 610 denotes a taper angle of the removal preventing film (isolated), numeral 611 denotes a projection amount of the silicon substrate (isolated), and numeral 612 denotes a height of the removal preventing film, respectively. FIGS. 25A and 25B are enlarged views showing the round part, wherein FIG. 25A shows the part in which the distance between the active regions is close and FIG. 25B shows the part in which the distance between the active regions is large.

As can be clear from the drawings, the size of the projection part (referred to as the projecting size, hereinafter) and the size of the round part (referred to as the round size, hereinafter) vary depending on the density of the pattern and the like.

SUMMARY OF THE INVENTION

Thus, it is an object of the present invention to reduce the above variation by controlling the projection amount and the round amount of the active region with high accuracy.

As factors of the above variation in projection amount and round amount, it is cited that the shape of the removal preventing film formed on the side wall at the time of etching becomes unstable due to a local change in gas flow rate and gas partial pressure, a change in gas flow rate and gas pressure on a wafer and a change in distribution of plasma.

In view of the above focusing points, the present invention is constituted as follows. A manufacturing method of a semiconductor device according to the present invention comprises:

a step of forming a first film and a second film on a semiconductor substrate in this order;

a step of forming a resist pattern on the second film;

a step of forming an opening by removing the second film exposed between the resist pattern at a state where the second film remains on the bottom;

a step of forming a first removal preventing film on the side wall of the opening and removing the residual film at a state where the projecting part of the second film protruding from the side wall to the opening remains;

a step of removing the first film exposed in the opening;

a step of removing the surface of the semiconductor substrate exposed in the opening at a state where a second removal preventing film on the first removal preventing film is formed, and the projecting part of the semiconductor substrate protruding from the side wall to the opening remains and a round part is formed at the projection part of the semiconductor substrate; and a step of further removing the semiconductor substrate exposed in the opening.

In addition, a manufacturing method of a semiconductor device according to the present invention comprises:

a step of forming a first film and a second film on a semiconductor substrate in this order;

a step of forming a resist pattern on the second film;

a step of forming an opening by removing the second film exposed between the resist pattern at a state where the second film remains on the bottom;

a step of removing the residual film at a state where the projecting part of the second film protruding from the side wall of the opening to the opening remains;

a step of removing the first film exposed in the opening;

a step of removing the surface of the semiconductor substrate exposed in the opening at a state where a second removal preventing film on the first removal preventing film is formed, and the projecting part of the semiconductor substrate protruding from the side wall to the opening remains and a round part is formed at the projection part of the semiconductor substrate; and a step of further removing the semiconductor substrate exposed in the opening.

In addition, a manufacturing method of a semiconductor device according to the present invention comprises:

a step of forming a first film and a second film on a semiconductor substrate in this order;

a step of forming a resist pattern on the second film;

a step of forming an opening by removing the second film exposed between the resist pattern;

a step of forming a first removal preventing film on the side wall of the opening and removing the first film at a state where the projecting part of the first film protruding from the side wall to the opening remains;

a step of removing the surface of the semiconductor substrate exposed in the opening at a state where a second removal preventing film on the first removal preventing film is formed, and the projecting part of the semiconductor substrate protruding from the side wall to the opening remains and a round part is formed at the projecting part of the semiconductor substrate; and a step of further removing the semiconductor substrate exposed in the opening.

A manufacturing method of a semiconductor device according to the present invention comprises:

a step of forming a first film and a second film on a semiconductor substrate in this order;

a step of forming a resist pattern on the second film;

a step of forming an opening by removing the second film exposed between the resist patterns;

a step of removing the first film at a state where the projecting part of the first film protruding from the side wall of the opening to the opening remains;

a step of removing the surface of the semiconductor substrate exposed in the opening at a state where a removal preventing film on the sidewall is formed, and the projecting part of the semiconductor substrate protruding from the side wall to the opening remains and a round part is formed at the projecting part of the semiconductor substrate; and a step of further removing the semiconductor substrate exposed in the opening.

According to this, the height of the removal preventing film that largely affects the formation of the projecting part and the round part of the semiconductor substrate can be lowered as much as possible, so that the variation in projection amount and round amount (size of the round part) in the round part can be prevented.

In the above respective constitutions, it is preferable that the projecting part of the second film is tapered so as to have a taper angle of 5° to 45° at the step of removing the residual film.

Furthermore, in the above respective constitutions, it is preferable that taper cutting of the upper end of the opening is carried out in view of stress alleviation and ensuring of reliability.

According to the present invention, the variation between wafers or the variation in the same wafer surface, caused by the density difference of the pattern of the active region width and the round shape (projection amount and round amount) after the opening has been formed, can be reduced.

BRIEF DESCRIPTION OF THE DRAWINGS

The objects, advantages and other novel features of the present invention will become apparent to those skilled in the art from the following detailed description when read in conjunction with the appended claims and accompanying drawings.

FIG. 8 is an enlarged view showing a silicon shoulder round part of the semiconductor device according to the first embodiment;

FIG. 18 is a schematic sectional view showing a manufacturing step of a semiconductor device according to a fourth embodiment;

DETAILED DESCRIPTION OF THE INVENTION

Figure 1:
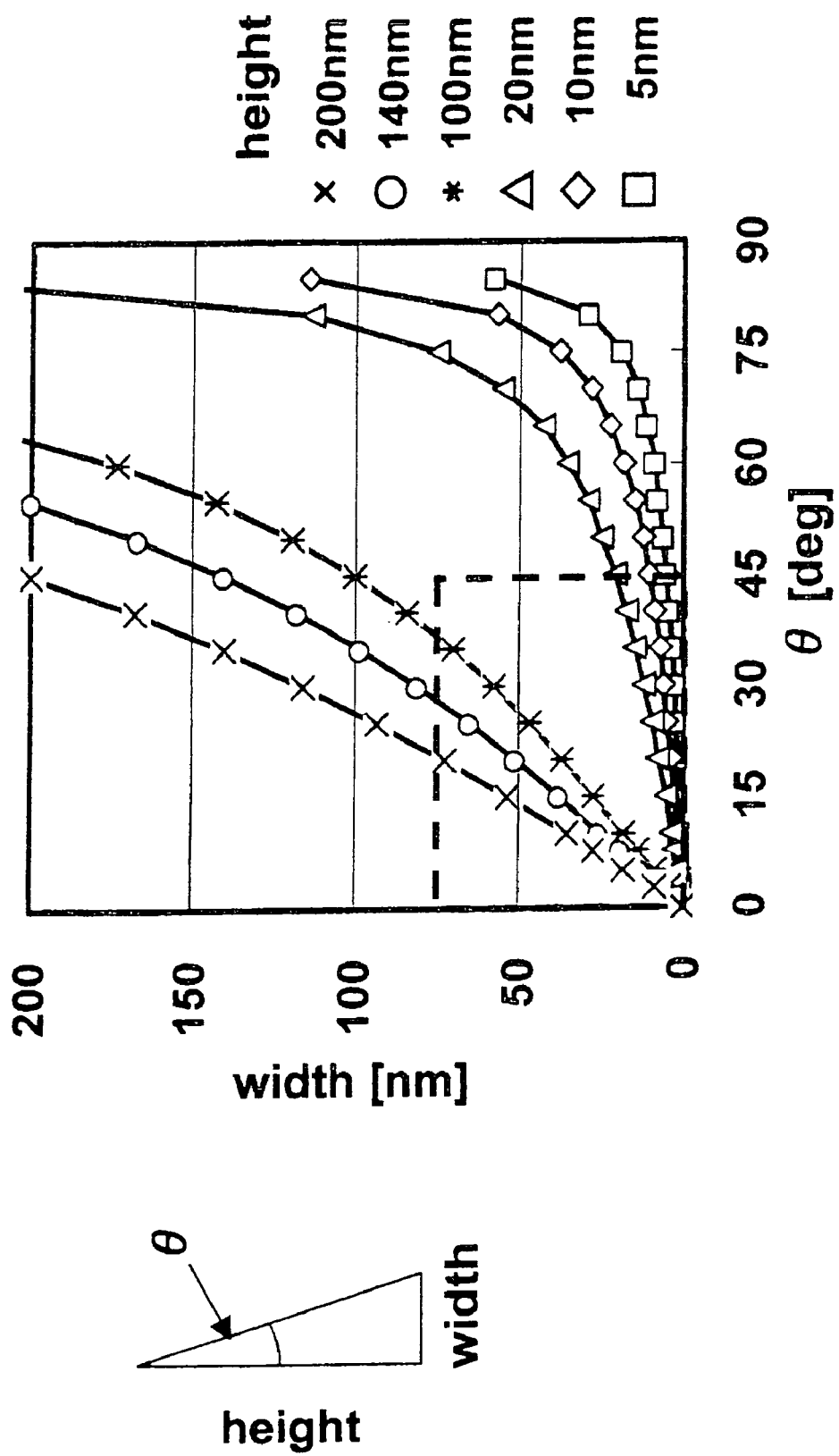
FIG. 1 is a graph showing the relation between a height and a width of a base and an angle θ in a right triangle to explain a problem.
Figure 2:
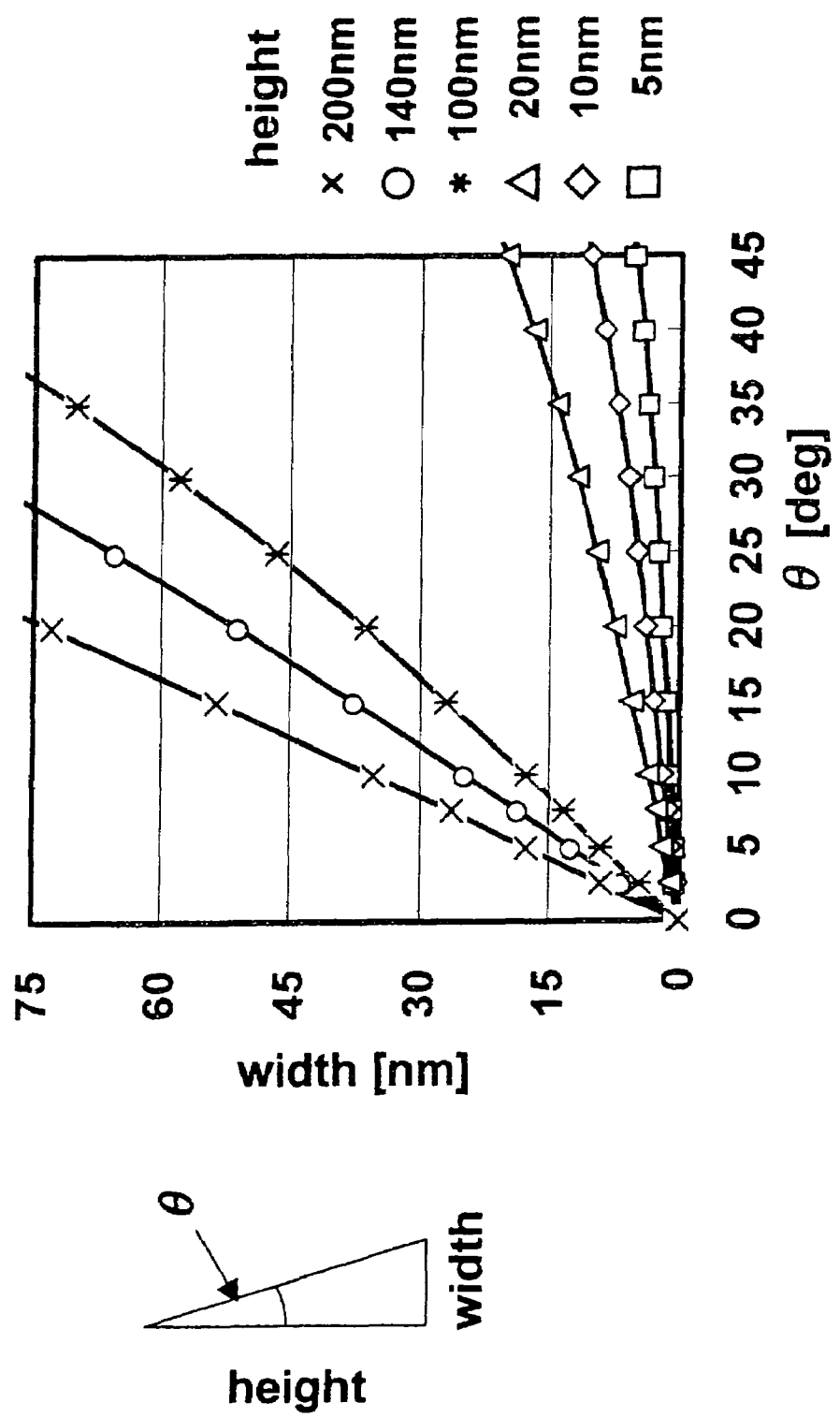
FIG. 2 is a graph showing the relation between the height and the width of the base and the angle θ in the right triangle to explain a problem.
Figure 3:
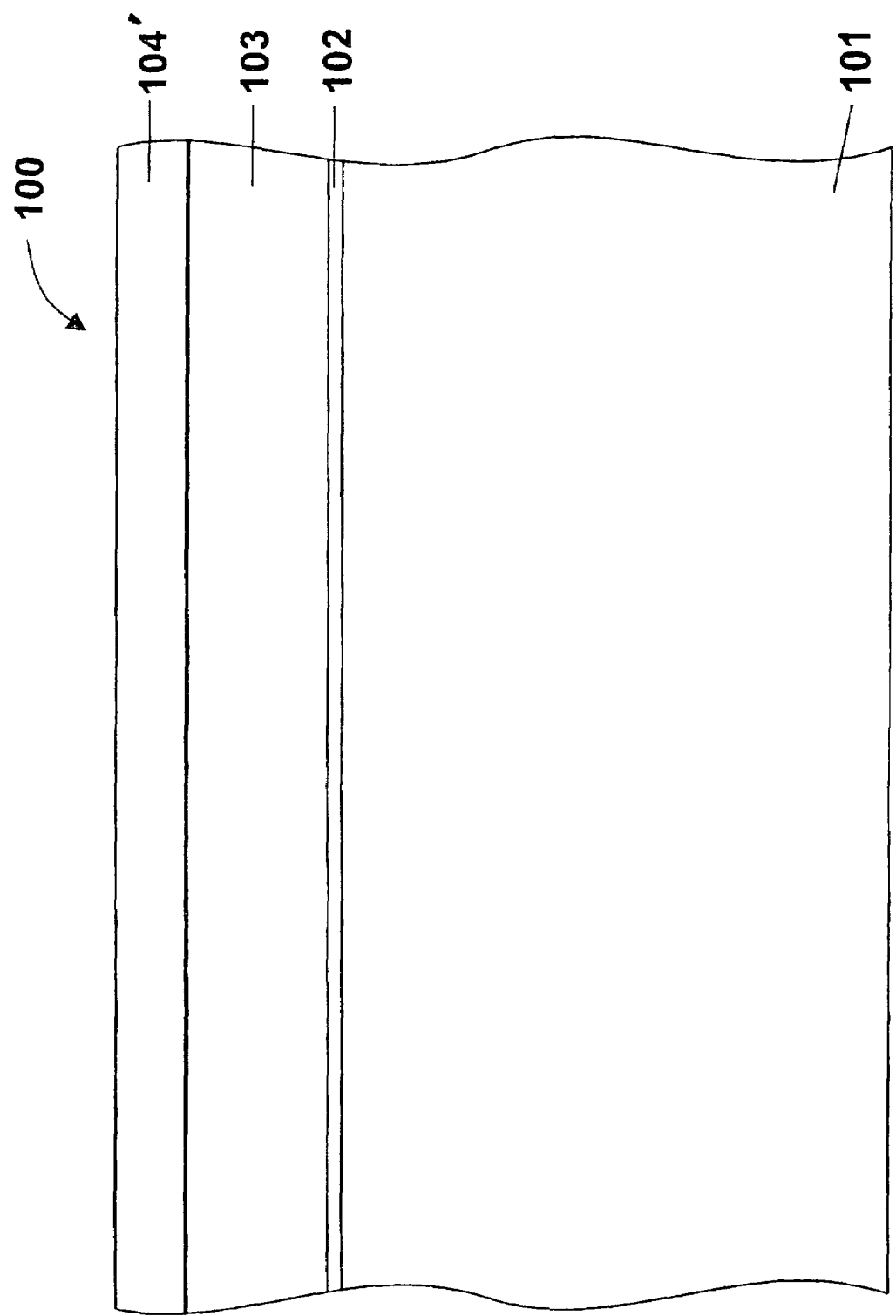
FIG. 3 is a schematic sectional view showing a manufacturing step of a semiconductor device according to a first embodiment.

Hereinafter, a manufacturing method of a semiconductor device according to an embodiment of the present invention will be described with reference to the drawings. First, reasons why the above-described problems can be solved by the present invention will be described in a way easy to understand with reference to FIGS. 1 and 2. FIGS. 1 and 2 show the relation between the height and the width of the base and the angle of a right triangle, and FIG. 2 is an enlarged view showing a part surrounded by a dotted line in a graph shown in FIG. 1.

As shown in FIGS. 1 and 2, the relation among the three components such as the height, the width of the base, and θ of the right triangle is as follows.

width of base=height×tan θ

This relation shows that the higher the height is, the larger the amount of the width of the base with respect to the angle of tan θ is. Based on this, the inventor of this application has found that the above problem can be solved when the height of a removal preventing film, that affects a projection amount and a round amount at a round part provided at an opening lower end, is lowered as much as possible in a removal preventing film that is attached onto an opening side wall. Based on the above finding, in the present invention, a manufacturing method, wherein the height of the removal preventing film can be lowered as much as possible, is supplied so as to prevent variation of the projection amount and the round amount at the round part.

Each of subsequent FIGS. 3 to 20 shows the pattern example of a part in which active regions are closely spaced on the left side and the pattern example of a part in which each active region is isolated on the right side, facing toward the figures.

First Embodiment

The first embodiment will be described with reference to FIGS. 3 to 8. First, at a step 1 shown in FIG. 3, a silicon oxide film (first film) 102 having thickness of 8 nm to 20 nm is formed on a p-type single-crystal silicon substrate (semiconductor substrate) 101 in a chamber atmosphere 100 by a thermal oxidation method. Then, a silicon nitride film (second film) 103 having thickness of 100 to 200 nm is deposited on the silicon oxide film 102 by a CVD method (vacuum pressure CVD method, plasma CVD method, high-density plasma CVD method, normal-pressure CVD method, or atomic layer deposition CVD method). Then, a photosensitive film (resist film) is coated onto the silicon nitride film 103 and performs patterning at exposing and developing steps to form a resist 104' that defines an element isolation region. At this time, in order to reduce reflected light at the time of lithography, a reflection reducing film may be deposited between the silicon nitride film 103 and the photosensitive film.

Figure 4:
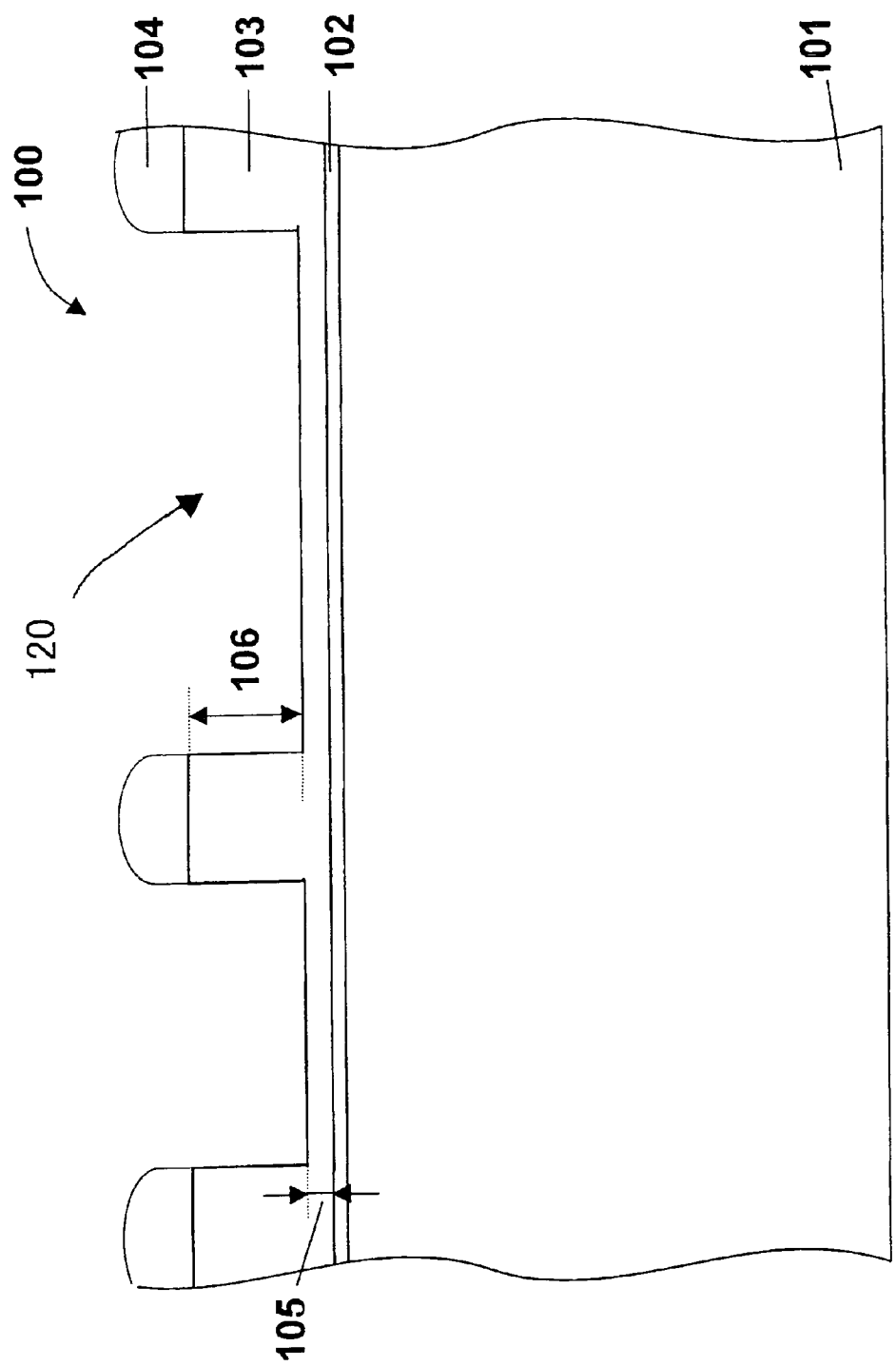
FIG. 4 is a schematic sectional view showing a manufacturing step of the semiconductor device according to the first embodiment.

Then, in a step 2 shown in FIG. 4, a resist pattern 104 for forming an opening 120 corresponding to the element isolation region in the substrate 101 is made of the resist 104' using a photolithography technique and then, the silicon nitride film 103 is etched away by anisotropic etching using the resist pattern 104 as a mask. In addition, the reference numeral 106 designates an etched amount (depth) of the silicon nitride film 103 in the drawing.

In the step for etching the silicon nitride film 103, a mixture gas of $CHF_3/CF_4/Ar/O_2$ is used for etching. At that time, the etching is stopped in a state where a part of the silicon nitride film 103 positioned at the bottom is left as a residual film 105. At this time, variation can be more prevented by monitoring the thickness to detect the final point. In addition, it is preferable that the thickness of the residual film 105 is 3 nm to 20 nm in order to control a taper angle at the lower end of the silicon nitride film 103 at a predetermined angle as will be described below.

At the time of etching, one or a mixture of $CHF_3$ having a flow rate of 10 sccm (standard cc/min) 107 to 50 sccm, $CF_4$ having a flow rate of 10 sccm to 50 sccm, $O_2$ having a flow rate of 5 sccm to 20 sccm, and Ar having a flow rate of 50 sccm to 500 sccm may be used as an etching gas.

Figure 5:
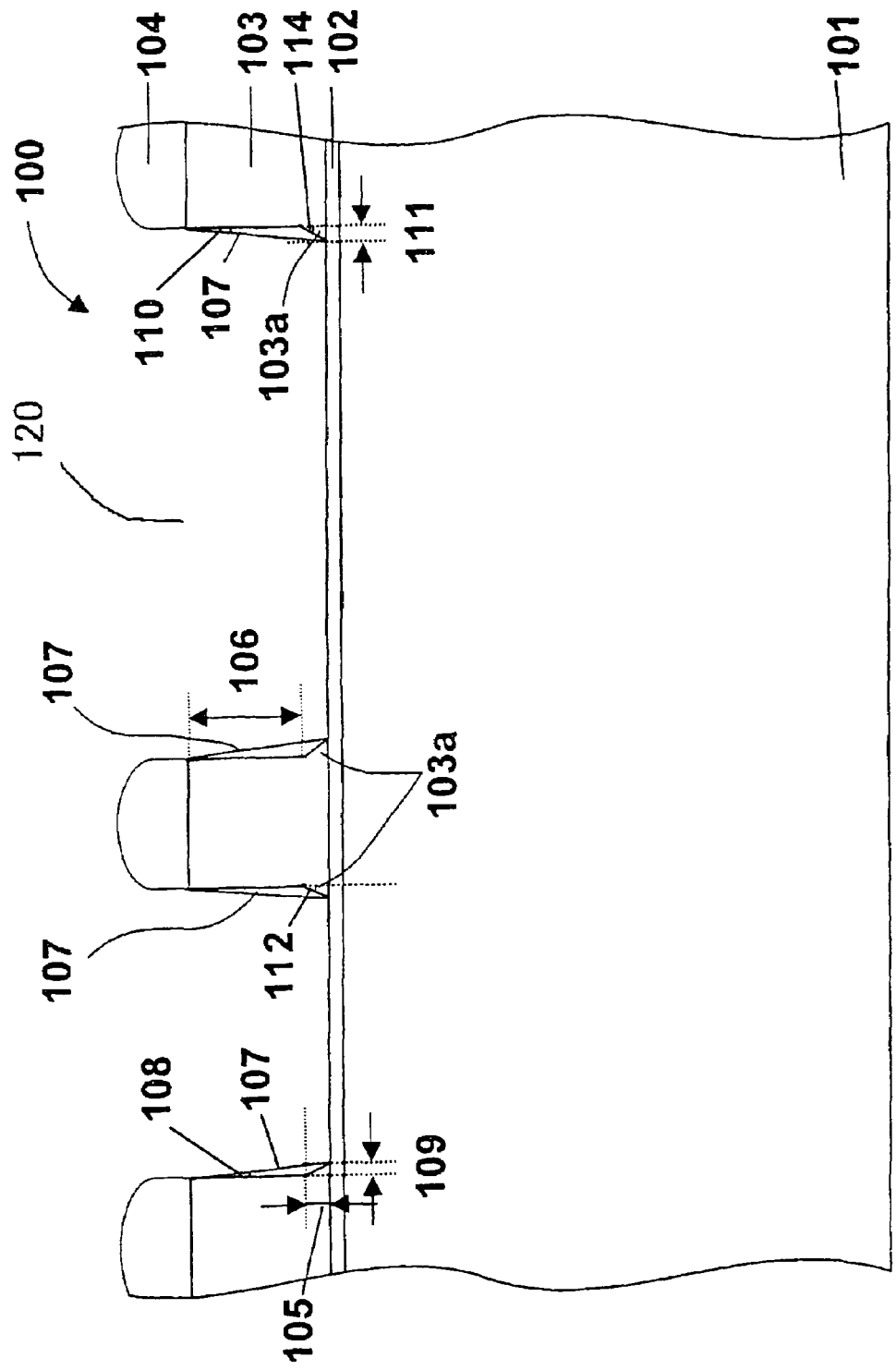
FIG. 5 is a schematic sectional view showing a manufacturing step of the semiconductor device according to the first embodiment.

Then, in a step 3 shown in FIG. 5, the residual film 105 is etched away. Here, the etching is performed to form the opening 120 under such condition (that is, the lower end of the silicon nitride film 103 is to be tapered) that a first removal preventing film (C-group deposition) that will be formed on the side wall of the opening 120 at a subsequent step can be easily attached. In this etching step, a projecting part 103a of the silicon nitride film 103 that projects from the side wall of the opening 120 to the opening 120 is formed. Furthermore, projection amounts 109 and 111 of the projecting part 103a can be adjusted by using an etching condition as will be described below. More specifically, while the first removal preventing film 107 is formed on the side wall of the opening 120, the residual film 105 is etched away, so that the projecting part 103a in which the lower end of the silicon nitride film 103 projects from the side wall of the opening 120 to the opening 120 is formed. In addition, the reference numerals 108 and 110 designate the taper angles of the first removal preventing film 107.

As the etching treatment performed at the step 3, there is a dry etching using one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm as an etching gas. In this case, it is preferable that the flow rate of $O_2$ is lower or the value of $CHF_3$ gas flow rate/$CF_4$ gas flow rate is larger than that in the step 2. For example, the taper angles 112 and 114 of the projecting part 103a can be controlled within a range of 5 to 45° by adjusting the mixed rate of the above etching gas. The reason why the taper angles 112 and 114 are set to 5 to 45° is due to the fact that the height and the width correspond to 1:1 in view of actual variations.

Meanwhile, when the silicon nitride film 103 is etched away, although the silicon oxide film 102 in its lower layer is also etched away, the etching condition is set so that the lower layer is not removed completely. The above etching step is performed with an etching device for the silicon nitride film 103.

Figure 6:
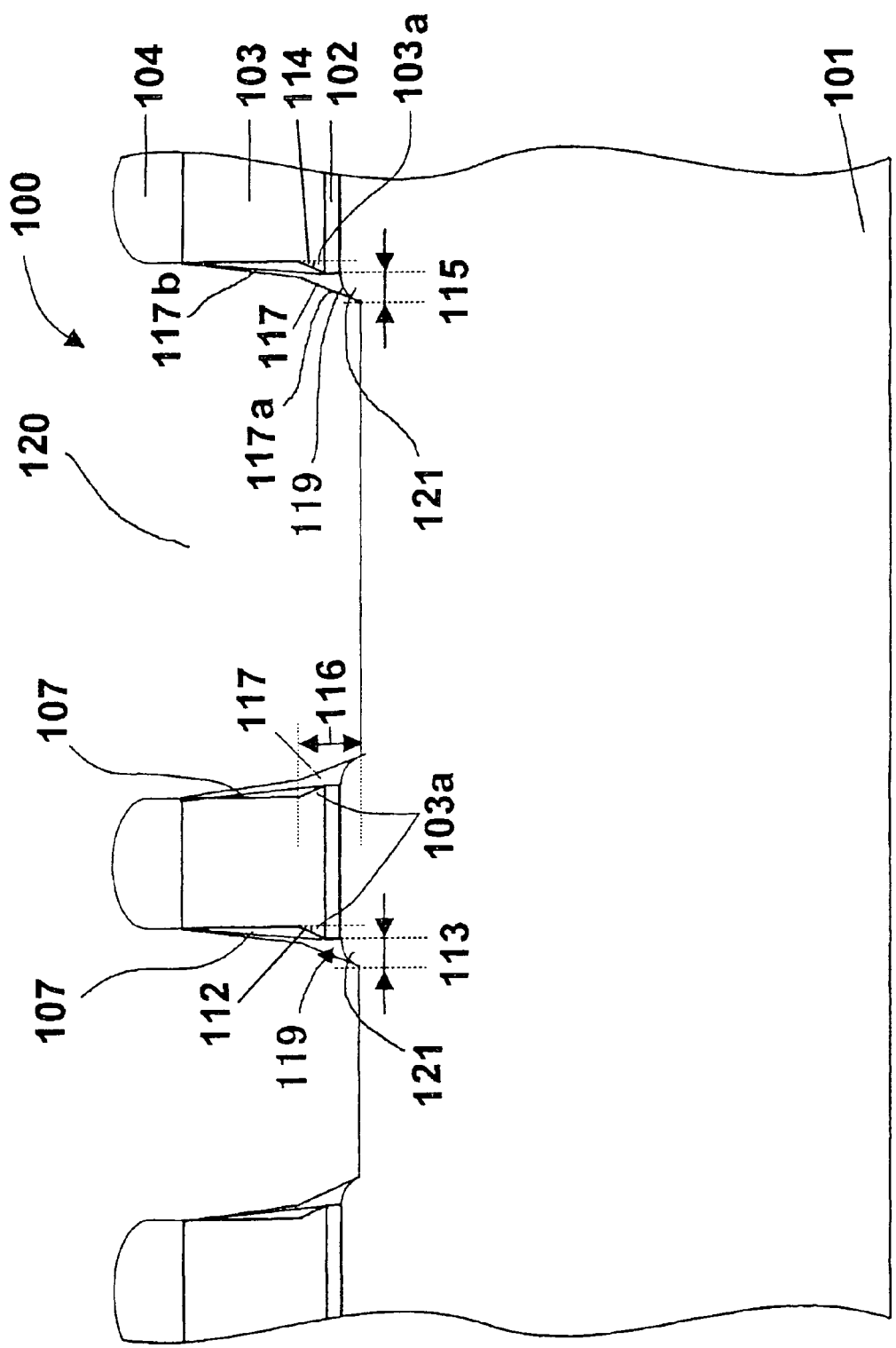
FIG. 6 is a schematic sectional view showing a manufacturing step of the semiconductor device according to the first embodiment.

Then, in a step 4 shown in FIG. 6, the silicon oxide film 102 is etched away. At this time, in order to remove a defective part such as a silicon spot generated on the surface of the silicon substrate 101, the etching is excessively performed. Here, one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm is used as an etching gas.

Then, in a step 5, the silicon substrate 101 is etched away using the resist pattern 104 and the first removal preventing film 107 as an etching mask to form a projecting part 121 at the silicon substrate 101 to be a trench upper shoulder part (active region shoulder part) and the projecting part 121 is rounded to form a round part 119. The projecting part 121 protrudes from the side wall of the opening 120 to the opening 120. In this round forming step, the surface of the silicon substrate 101 is etched away using hydrogen bromide (HBr) as an etching gas to adjust projection amounts 113 and 115 of the projecting part 121 positioned at the illustrated trench upper shoulder part. At this time a second removal preventing film (C-group deposition) 117, that affects the variation in projection amounts 113 and 115, and the round amount, is formed.

Here, since the silicon nitride film 103 comprises the projecting part 103a protruding in its lateral direction, the second removal preventing film 117 provided so as to cover the projecting part 103a has a two-step slanting shape having a lower slanting portion 117a and an upper slanting portion 117b. The slanting angle of the lower slanting portion 117a is smaller than that of the upper slanting portion 117b. Furthermore, a height 116 of the lower slanting portion 217a constituting a part of the second removal preventing film 217 is smaller than that of the whole second removal preventing film 217 as a matter of course. The height 116 of the lower slanting portion 117a largely affects the projection amounts 113 and 115 of the projecting part 121 and the round shape of the round part 119 provided at the trench upper shoulder part of the silicon substrate 101. Hence, when the height 116 is adjusted (to be made small), the projection amounts 113 and 115 of the projecting part 121 and the round shape of the round part 119 can be controlled.

The height of the second removal preventing film 117 that largely affects the projection amounts 113 and 115 of the projecting part 121 and the round shape of the round part 119 is controlled to be low. Therefore, the variations in projection amounts 113 and 115 and the round amount can be reduced.

Thus, while the second removal preventing film 117 is formed on the first removal preventing film 107, the surface of the exposed silicon substrate 101 is etched away to form the round part 119 at the trench upper shoulder part with high accuracy. In addition, the reference numerals 112 and 114 designate taper angles of the second removal preventing film 117.

In the step 5, etching is performed using the etching gas containing hydrogen bromide (HBr) gas having a flow rate of 20 to 100 sccm to adjust the shape of the round part 119 (projection amount and round amount). In addition, the etching can be performed by further adding helium (He) to the etching gas. In this case, it is desirable that an apply power to a lower electrode is set in a range of 200 to 500 W.

Figure 7:
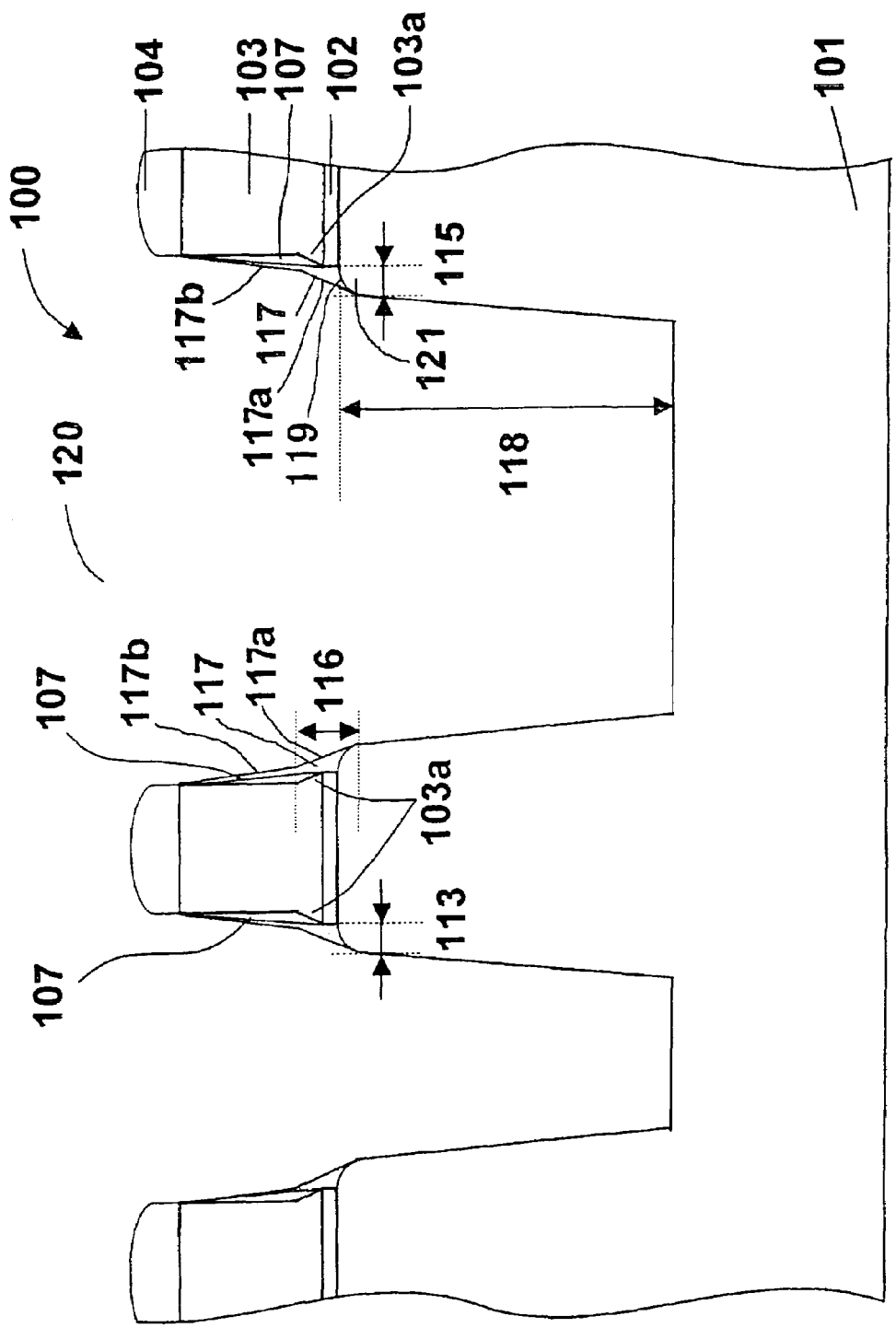
FIG. 7 is a schematic sectional view showing a manufacturing step of the semiconductor device according to the first embodiment.

In a step 6 shown in FIG. 7, the silicon substrate 101 on the bottom of the opening 120 is etched away till a set depth using the second removal preventing film 117 attached on the side walls of the resist pattern 104, the silicon nitride film 103 and the silicon oxide film 102 as a mask so as to form a trench 118. At this time, as an etching gas, a mixed gas of $Cl_2$ having a flow rate of 50 to 200 sccm and $O_2$ having a flow rate of 1 to 20 sccm is used. The above etching step is performed with an etching device. Furthermore, the upper end of the opening 120 is tapered.

According to the manufacturing method of the semiconductor device having the above constitution, as shown in enlarged views showing the round part 119 in FIGS. 8A and 8B, at the part in which the active regions are crowded shown in FIG. 8A, the taper angles 112 and 114 of the second removal preventing film 117 are changed in a region located in a lower side than the projecting part 103a of the silicon nitride film 103, and the height of the second removal preventing film 117 at that portion affects the projection amounts 113 and 115 and the round amount. In addition, in FIGS. 8A and 8B, the reference numeral 116 corresponds to the height and the reference numerals 113 and 115 correspond to the width and the reference numerals 112 and 114 correspond to the angle θ respectively in FIGS. 1 and 2.

Figure 25B:
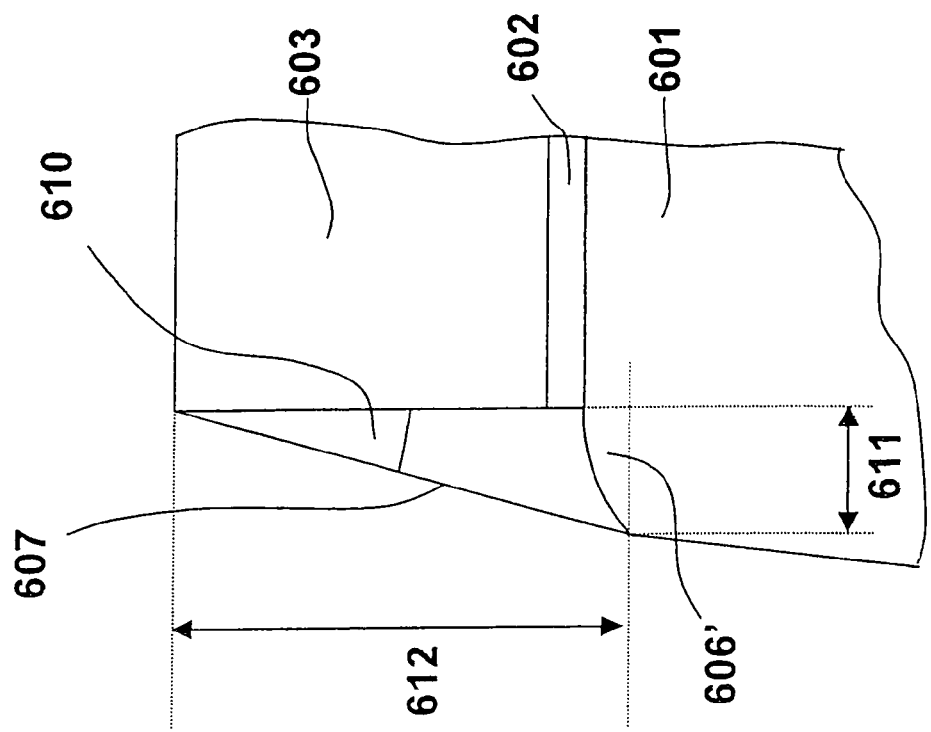
FIG. 25B is an enlarged view showing the silicon shoulder round part of the conventional semiconductor device.
Figure 25A:
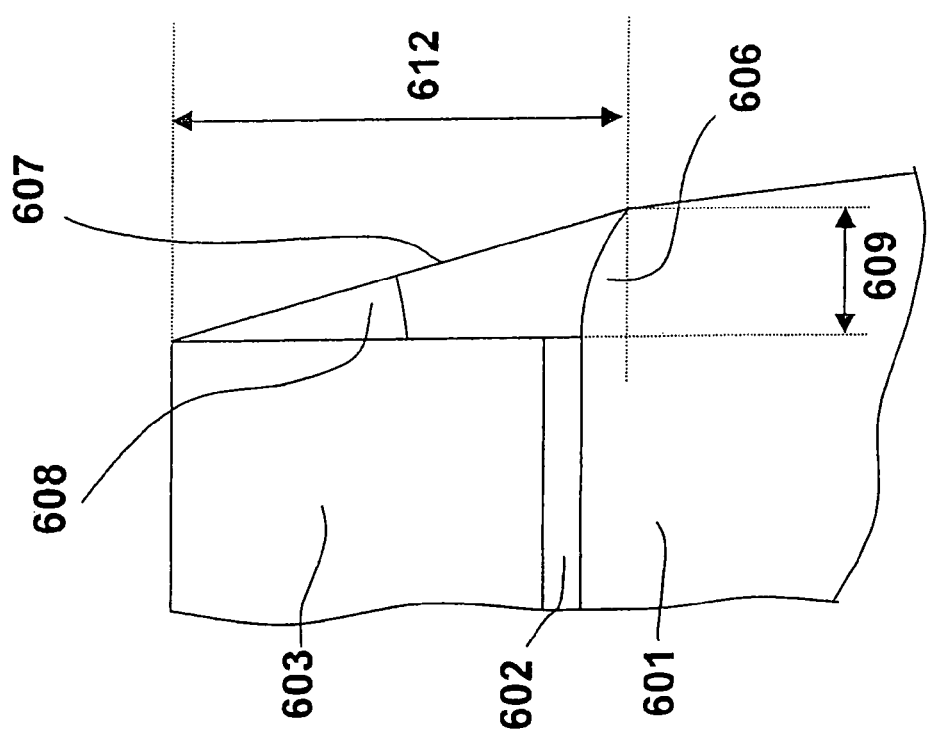
FIG. 25A is an enlarged view showing a silicon shoulder round part of a conventional semiconductor device.

Meanwhile, according to the conventional example, as shown in FIG. 25, the height extends across from the upper surface of a silicon substrate 601 to the upper surface of a silicon nitride film 603. In addition, in FIG. 25, the reference numeral 612 corresponds to the height and the reference numerals 609 and 611 correspond to the width and the reference numerals 608 and 610 correspond to the angle θ respectively.

Thus, according to this embodiment, since the projecting part 103a is formed in the silicon nitride film 103, the height, that is, the height of the lower slanting portion 117a of the second removal preventing film 117 can be lowered as much as possible. Thus, the projection amounts 113 and 115 and the round amount of the round part 119 can be prevented from varying, and a dimensional difference (variation) on a wafer or between wafers can be prevented from being generated depending on density difference of a pattern.

Second Embodiment

A second embodiment of the present invention will be described with reference to FIGS. 9 and 10. In addition, in FIGS. 9 and 10, the reference numeral 200 designates a chamber atmosphere, the reference numeral 201 designates a silicon substrate, the reference numeral 202 designates a silicon oxide film, the reference numeral 203 designates a silicon nitride film, the reference numeral 203a designates a projecting part of the silicon nitride film 203, the reference numeral 204 designates a resist pattern, the reference numeral 205 designates a residual film of the silicon nitride film 203, the reference numeral 206 designates an etching amount of the silicon nitride film 203, the reference numerals 209 and 211 designate projection amounts of the projecting part 203a, the reference numeral 217 designates a second removal preventing film, the reference numeral 212 designates a taper angle of the second removal preventing film 217, the reference numeral 220 designates an opening, the reference numeral 221 designates a projection amount of the silicon substrate 201, the reference numeral 219 designates a round part provided at the projecting part 221, the reference numerals 213 and 215 designate projection amounts of the projecting part 221, the reference numeral 214 designates a taper angle of the second removal preventing film 217, and the reference numeral 216 designates a height of the second removal preventing film 217.

Although the second embodiment proposes a forming method different from that in the first embodiment, it is formed until the step 2 shown in FIG. 4 using the same constitution, and then in step 3, the residual film 205 of the silicon nitride film 203 is etched away under the following condition.

Figure 9:
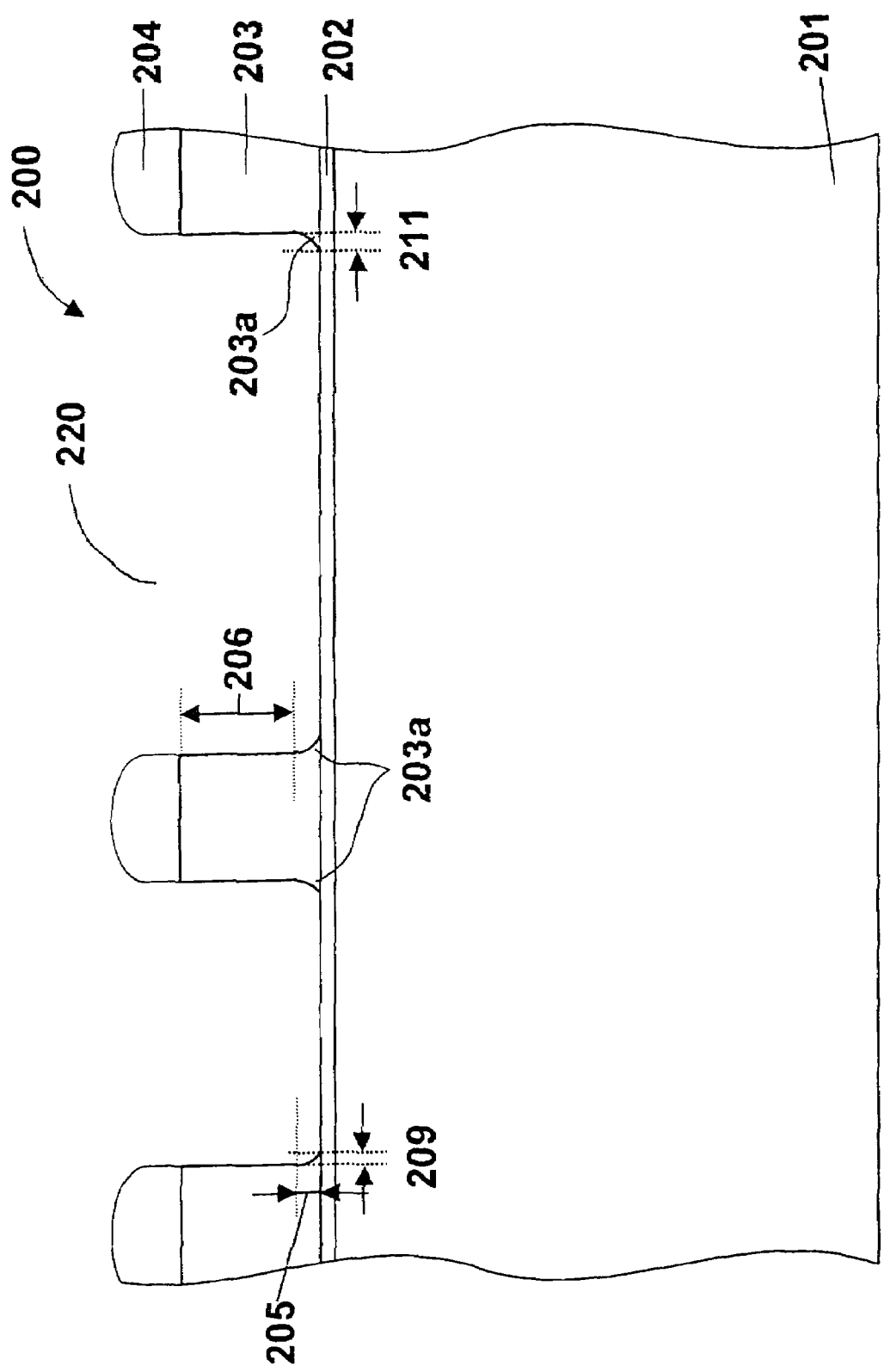
FIG. 9 is a schematic sectional view showing a manufacturing step of a semiconductor device according to a second embodiment.

That is, in step 3 shown in FIG. 9, the condition in which isotropic etching can be performed is set when the residual film 205 is etched away. At this time, the projecting part 203a of the silicon nitride film 203 that projects from the side wall of the opening 220 toward the opening 220 is made in a remaining state by using an etching condition as will be described below. At this time, the projection amounts 209 and 211 of the projecting part 203a to the opening 220 are controlled through adjusting the etching condition. In addition, it is preferable that the projection amounts 209 and 211 are smaller than the film thickness of the residual film 205.

When dry etching is employed in the step 3, a mixture of $CF_4$ having a flow rate of 50 sccm to 200 sccm and $O_2$ having a flow rate of 5 sccm to 50 sccm is used as an etching gas. In addition, when wet etching is employed, the etching is performed using a phosphoric acid solution at 160° C. or more. Thus, the isotropic etching is performed.

Meanwhile, though the silicon oxide film 202 as the lower layer is also etched away at the time of the above etching of the silicon nitride film 203, the etching condition is set so that the silicon oxide film 202 is not completely removed.

Figure 10:
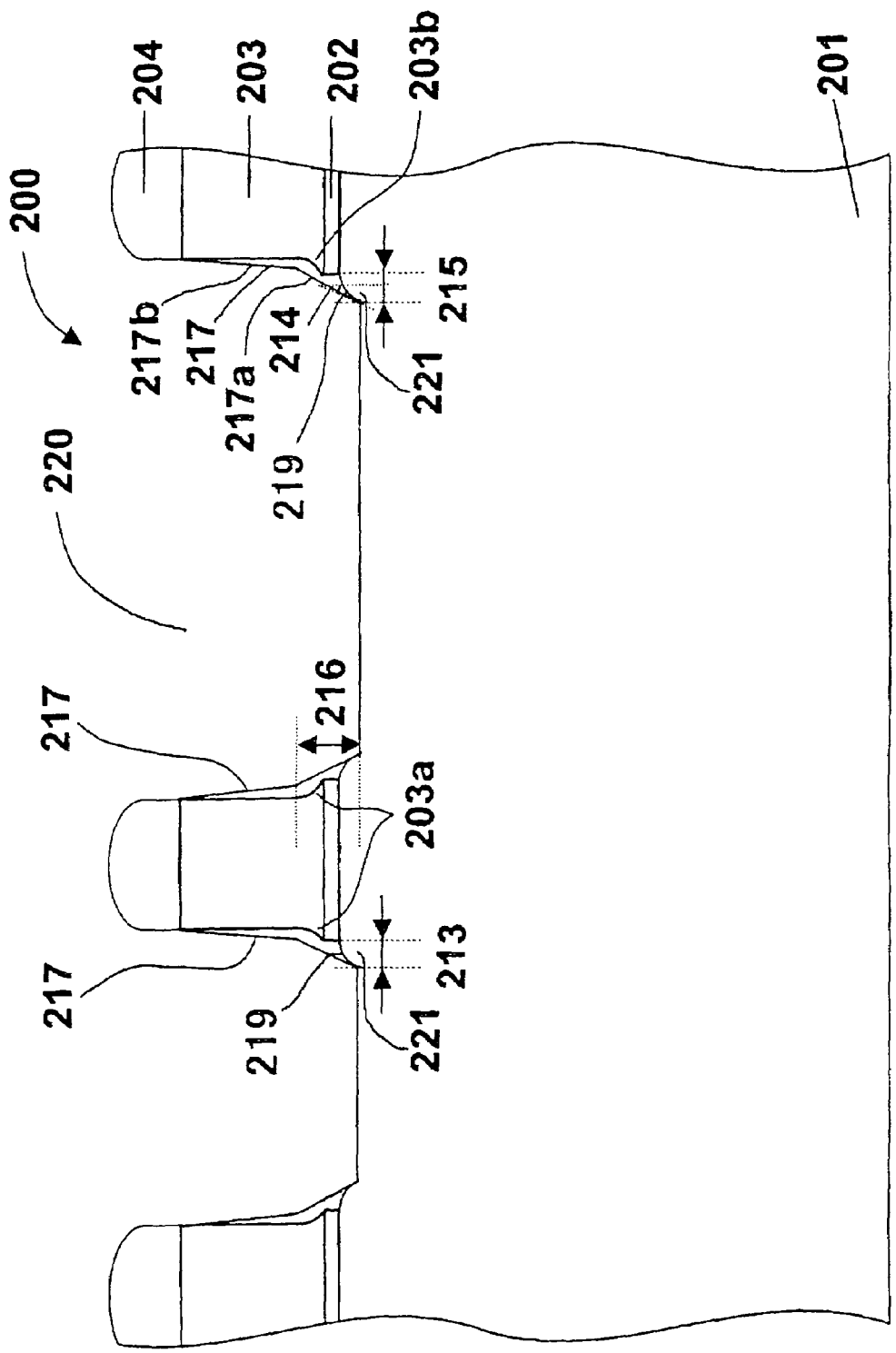
FIG. 10 is a schematic sectional view showing a manufacturing step of the semiconductor device according to the second embodiment.

Then, in step 4 shown in FIG. 10, the silicon oxide film 202 is etched away. At this time, in order to remove a defective part such as a silicon spot generated on the surface of the silicon substrate 201, the etching is excessively performed.

As the etching process performed in the step 4, there is dry etching that uses one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm as an etching gas. In this case, it is preferable that the flow rate of $O_2$ is lower or the value of $CHF_3$ gas flow rate/$CF_4$ gas flow rate is larger than that in the step 2.

Then, in a step 5, the silicon substrate 201 is etched away using the resist pattern 204 as an etching mask to form a projecting part 221 protruding from the side wall of the opening 220 toward the opening 220 at the silicon substrate 201 to be a trench upper shoulder part and further a step to form a round part 219 at the projecting part 221 is carried out. In this round forming step, the surface of the silicon substrate 201 is etched away by dry etching (isotropic etching) using hydrogen bromide (HBr) as an etching gas to while forming the removal preventing film 217 on the side walls of the hard mask (silicon oxide film 202 and silicon nitride film 203).

Here, since the silicon nitride film 203 comprises the projecting part 203a projecting in its lateral direction, the removal preventing film 217 provided so as to cover the projecting part 203a has a two-step slanting shape having a lower slanting portion 217a and an upper slanting portion 217b. The slanting angle of the lower slanting portion 217a is smaller than that of the upper slanting portion 217b. Furthermore, a height 216 of the lower slanting portion 217a constituting a part of the removal preventing film 217 is smaller than that of the whole second removal preventing film 217 as a matter of course. The height 216 of the lower slanting portion 217a largely affects the projection amounts 213 and 215 of the projecting part 221 and the round shape of the round part 219 provided at the silicon substrate 101 to be the trench upper shoulder part. Hence, the projection amounts 213 and 215 of the projecting part 221 and the round shape of the round part 219 provided at the silicon substrate 201 in the trench upper shoulder part can be controlled by adjusting the height 216 (to be small). For example, etching is performed using etching gas containing hydrogen bromide having a flow rate of 20 to 100 sccm to form the round part 219 at the trench upper shoulder part with high accuracy. In addition, the etching can be performed through adding helium (He) to the etching gas. At this time, it is preferable that a power applied to the lower electrode is set to 200 to 500 W. Here, the projection amounts 213 and 215 means the projection amount of the silicon substrate 201 in the trench upper shoulder part from the side wall of the opening 220 toward the opening 220. The height 216 of the lower slanting portion 217a can be controlled through adjusting the projection amounts 209 and 211 of the projecting part 203a of the silicon nitride film 203.

As described above, while the removal preventing film 217 is formed on the side wall of the opening 220, the surface of the silicon substrate 201 exposed in the bottom of the opening 220 is etched away in order to provide the projecting part 221 of the silicon substrate 201 on the side wall of the opening 220 and form the round part 219 at the projecting part 211.

At this time, as described above, since the projection amounts 213 and 215 of the projecting part 203a of the silicon nitride film 203 and the size (round amount) of the round part 219 are affected by the height of the removal preventing film 217, the higher the removal preventing film 217, the larger the variation in shape of the round part 219. Meanwhile, according to this embodiment, the removal preventing film 217 is divided into the lower slanting portion 217a and the upper slanting portion 217b, and the height of the removal preventing film 217 that affects the projection amounts 213 and 215 and the round amount of the round part 219 (projecting part 221) is made only a part of it, that is, the height 216 of the lower slanting portion 217a. Thus, the height of the removal preventing film 217 that affects the projection amounts 213 and 215 and the round amount of the round part 219 can be lowered as much as possible, so that the variation in shape of the round part 219 can be prevented. In addition, subsequent steps are performed similar to the first embodiment.

Figure 11A:
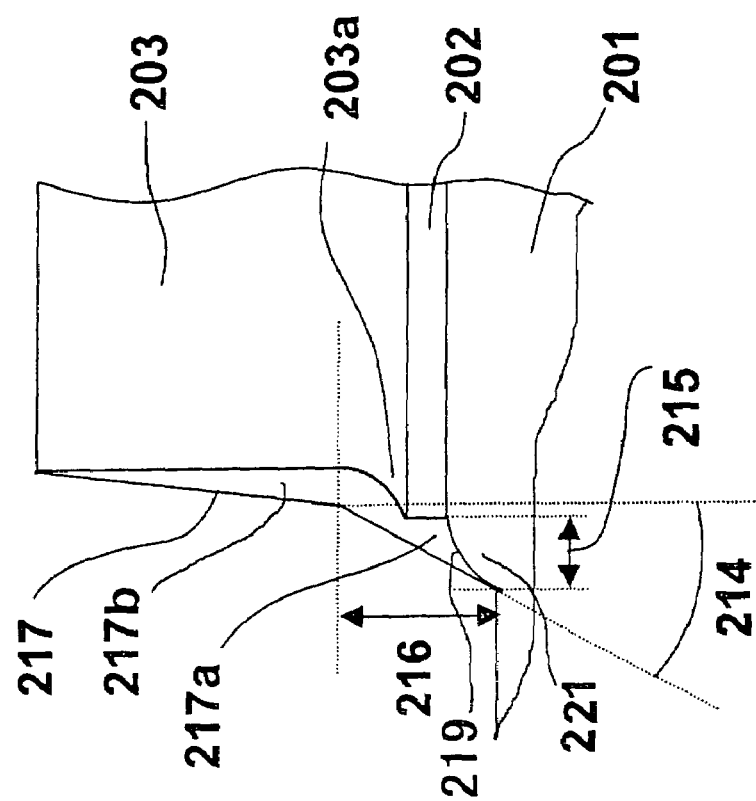
FIG. 11 is an enlarged view showing a silicon shoulder round part of the semiconductor device according to the second embodiment.
Figure 11B:
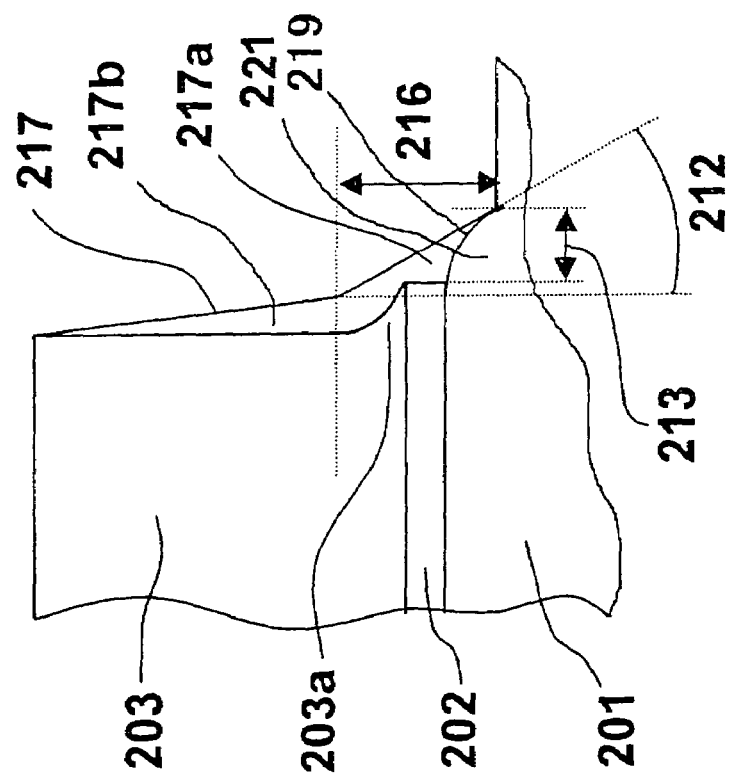

According to the manufacturing method of the semiconductor device having the above constitution, as shown in enlarged views showing the round part 219 in FIGS. 11A and 11B, at the part in which the active regions are packed (refer to FIG. 11A), since the taper angles 212 and 214 of the lower slanting portion 217a of the removal preventing film 217 are changed more gently than the taper angle at the upper slanting portion 217b, in the lower side of the projecting part 203a of the silicon nitride film 203, the height of the removal preventing film 217 that affects the projection amounts 213 and 215 and the round amount of the round part 219 becomes the height 216 of the lower slanting portion 217a. That is, in FIGS. 11A and 11B, the reference numeral 216 corresponds to the height and the reference numerals 213 and 215 correspond to the width and the reference numerals 212 and 214 correspond to the angle θ respectively in FIGS. 1 and 2.

As described above, according to this embodiment, since the projecting part 203a is formed at the lower end of the silicon nitride film 203, the height 216 of the removal preventing film 217 that affects the projection amounts 213 and 215 and the round amount of the round part 219 can be lowered as much as possible. Thus, the projection amounts 213 and 215 and the round amount of the round part 219 can be prevented from varying, and a dimensional difference (variation) in the active region width or the round shape after the trench etching on a wafer or between wafers can be prevented from being generated depending on a pattern density.

Third Embodiment

A third embodiment of the present invention will be described with reference to FIGS. 12 to 17. In addition, in FIGS. 12 to 17, the reference numeral 300 designates a chamber atmosphere, the reference numeral 301 designates a silicon substrate, the reference numeral 302 designates a silicon oxide film, the reference numeral 303 designates a silicon nitride film, and the reference numeral 304 designates a resist pattern.

Figure 12:
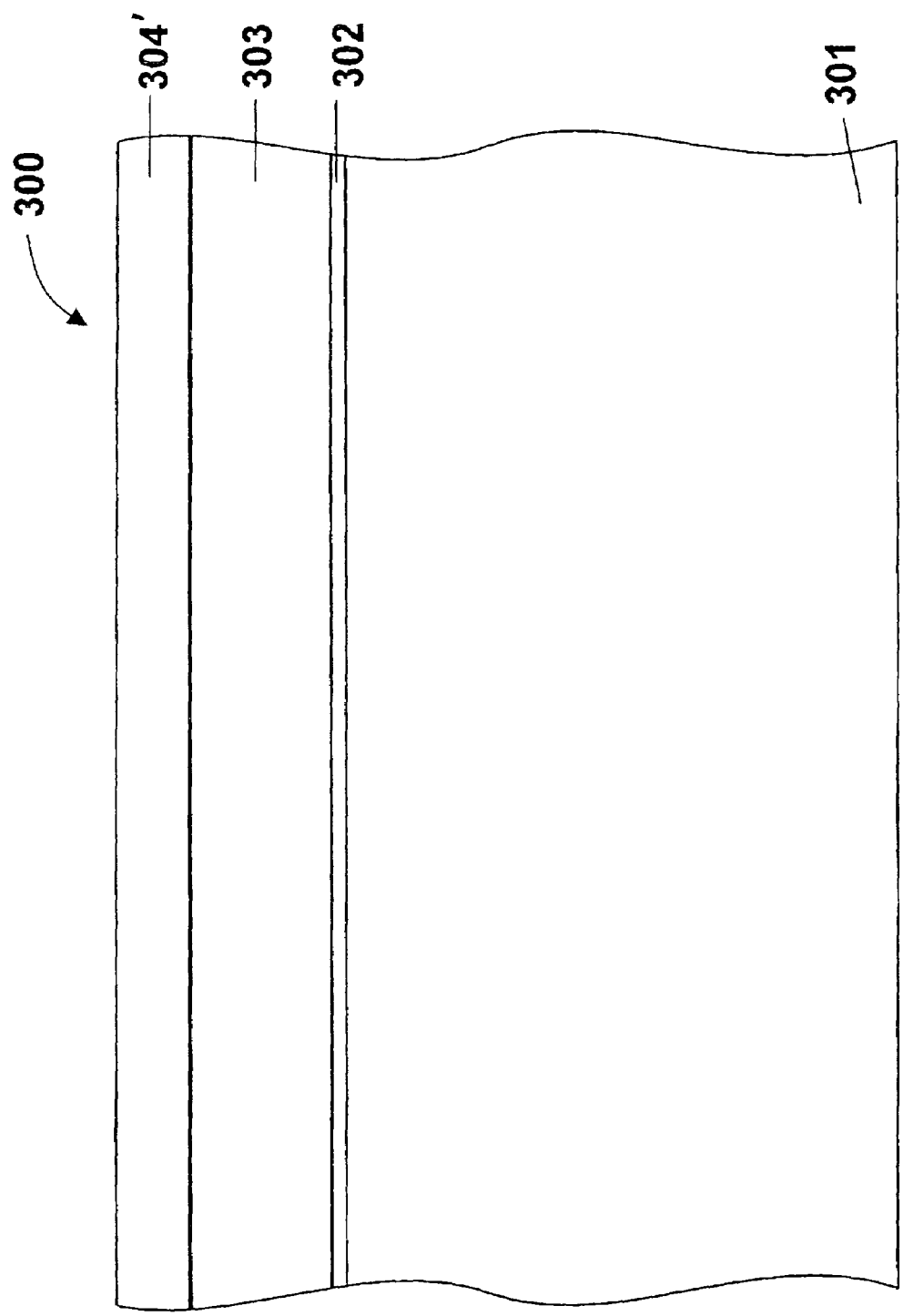
FIG. 12 is a schematic sectional view showing a manufacturing step of a semiconductor device according to a third embodiment.

A step 1 shown in FIG. 12 is similar to the step 1 (FIG. 3) in the first embodiment. Then, in step 2 shown in FIG. 13, a resist pattern 304 is formed so as to correspond to an element isolation region using a photolithography technique and then, the silicon nitride film 303 is etched away by anisotropic etching using the resist pattern 304 as a mask to form an opening in the silicon nitride film 303. In a step for etching the silicon nitride film 303, dry etching is performed using a mixture gas of $CHF_3/CF_4/Ar/O_2$ until the silicon oxide film 302 of the lower layer is exposed. At this time, the exposure of the silicon oxide film 302 is detected by detecting a spectrum of an oxygen gas generated when the silicon oxide film 302 is etched, and the etching is stopped at that time.

In a specific example, the dry etching uses one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm as an etching gas. The above etching step is performed with the etching device for the silicon nitride film.

Figure 14:
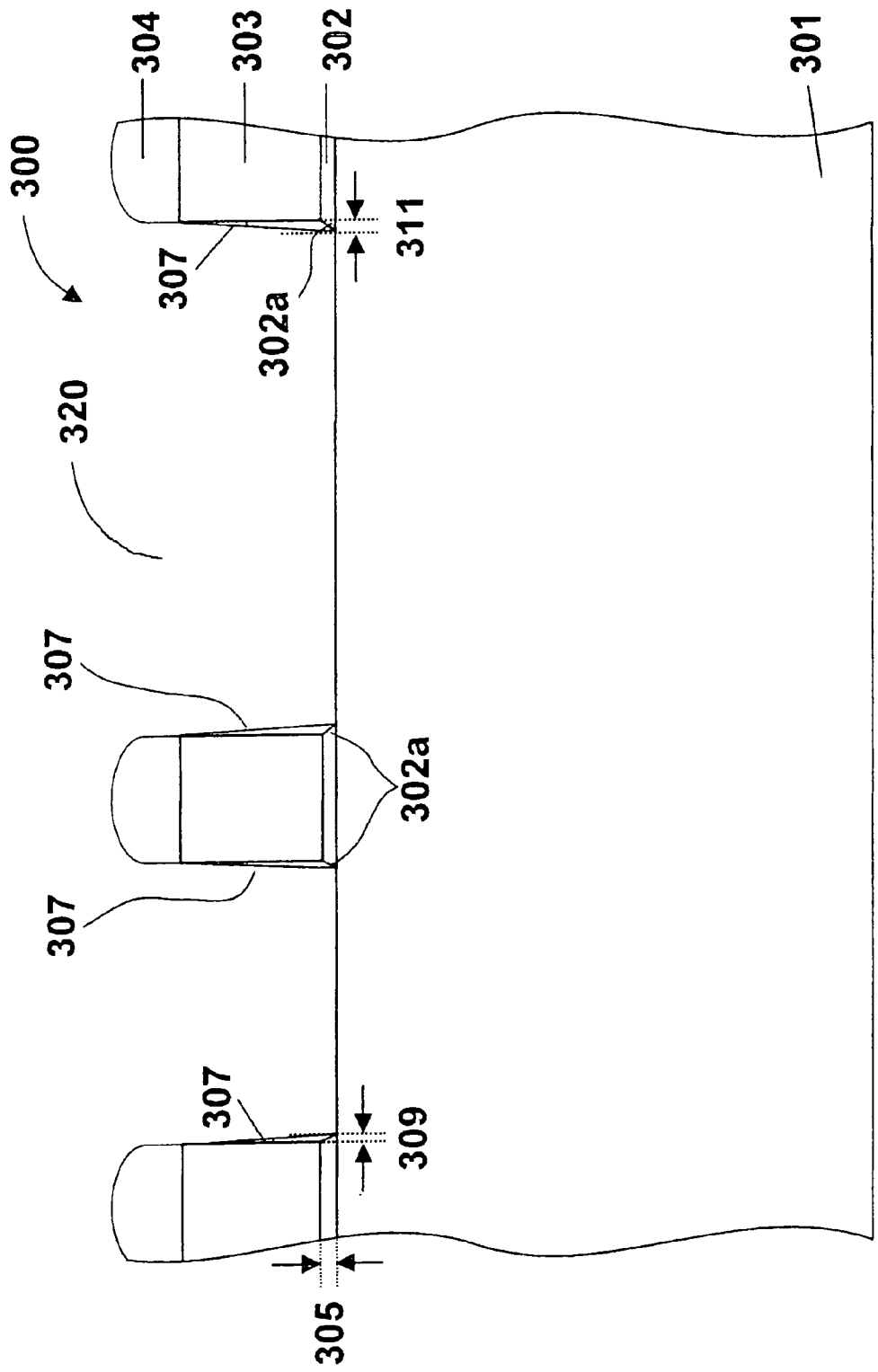
FIG. 14 is a schematic sectional view showing a manufacturing step of the semiconductor device according to the third embodiment.

Then, in a step 3 shown in FIG. 14, the silicon oxide film 302 is etched away. Here, the etching is performed under the condition such that a first removal preventing film 307 that will be formed on the side wall of an opening 320 can be easily attached (that is, the condition that the end of the silicon oxide film 302 is formed so as to be tapered). Then, the first removal preventing film 307 is formed on the side wall of the opening 320. Furthermore, a projecting part 302a of the silicon oxide film 302 protruding from the side wall of the opening 320 toward the opening 320 remains. In this etching step, projection amounts 309 and 311 of the projecting part 302a are adjusted by using the following etching condition.

In the etching condition described above, for example, one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm is used as an etching gas. In this case, it is preferable that the value of $CHF_3$ gas flow rate/$CF_4$ gas flow rate is larger than that of the step 2. For example, the taper angles 312 and 314 of the projecting part 302a can be controlled within a range of 5 to 45° (refer to FIG. 17) by adjusting the mixed rate of the above etching gas.

Figure 15:
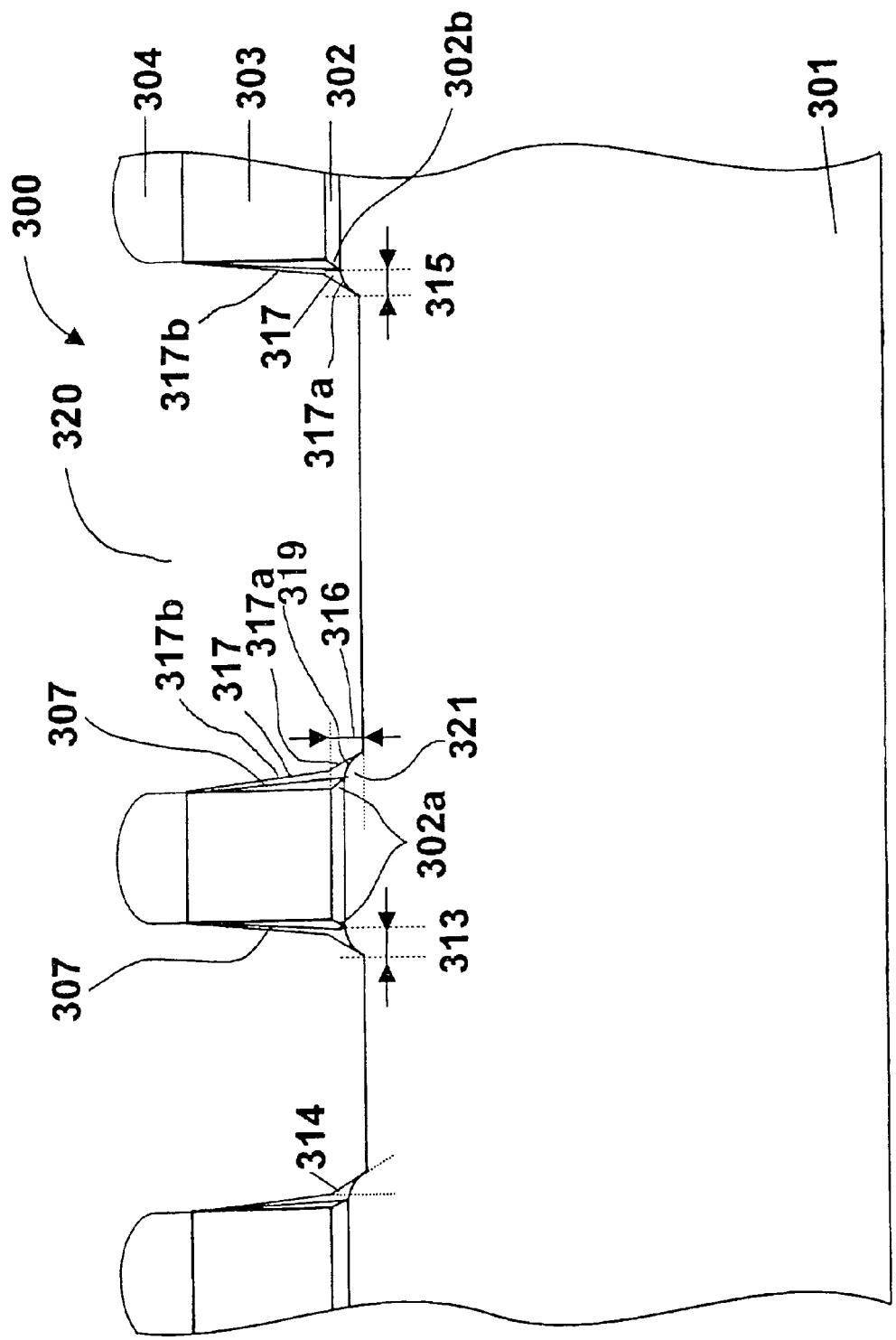
FIG. 15 is a schematic sectional view showing a manufacturing step of the semiconductor device according to the third embodiment.

Then, in step 4 shown in FIG. 15, the surface of the silicon substrate 301 is etched away using the resist pattern 304, the first removal preventing film 307 and the projecting part 302a as an etching mask.

At this time,

The second removal preventing film 317 is formed on the first removal preventing film 307.

The projecting part 321 of the silicon substrate 301 protruding from the side wall of the opening 320 toward the opening 320 remains.

The round part 319 is formed at the projecting part 321 of the silicon substrate 301.

In the step 4, the surface of the silicon substrate 301 is etched away using hydrogen bromide (HBr). At this time, since the projecting part 302a is provided at the silicon oxide film 302, the second removal preventing film 317 has a two-step slanting shape having a lower slanting portion 317a and an upper slanting portion 317b. The slanting angle of the lower slanting portion 317a is smaller than that of the upper slanting portion 317b. Furthermore, a height 316 of the lower slanting portion 317a constituting a part of the second removal preventing film 317 is smaller than that of the whole second removal preventing film 317 as a matter of course. The height 316 of the lower slanting portion 317a largely affects the projection amounts 313 and 315 of the projecting part 321 and the round shape of the round part 319 provided at the trench upper shoulder part of the silicon substrate 301. Hence, the projection amounts 313 and 315 of the projecting part 321 and the round shape of the round part 319 can be controlled by adjusting when the height 316 (repressed to be small). Thus, while the second removal preventing film 317 is formed on the first removal preventing film 307, the surface of the exposed silicon substrate 301 is etched away to form the round part 319 at the trench upper shoulder part with high accuracy.

in the step 4, the etching is performed using the etching gas containing hydrogen bromide (HBr) gas having a flow rate of 20 to 100 sccm to adjust the shape (projection amount and round amount) of the round part 319. In addition, the etching can be performed through further adding helium (He) to the etching gas. In this case, it is desirable that a power applied to a lower electrode is set to 200 to 500 W.

Figure 16:
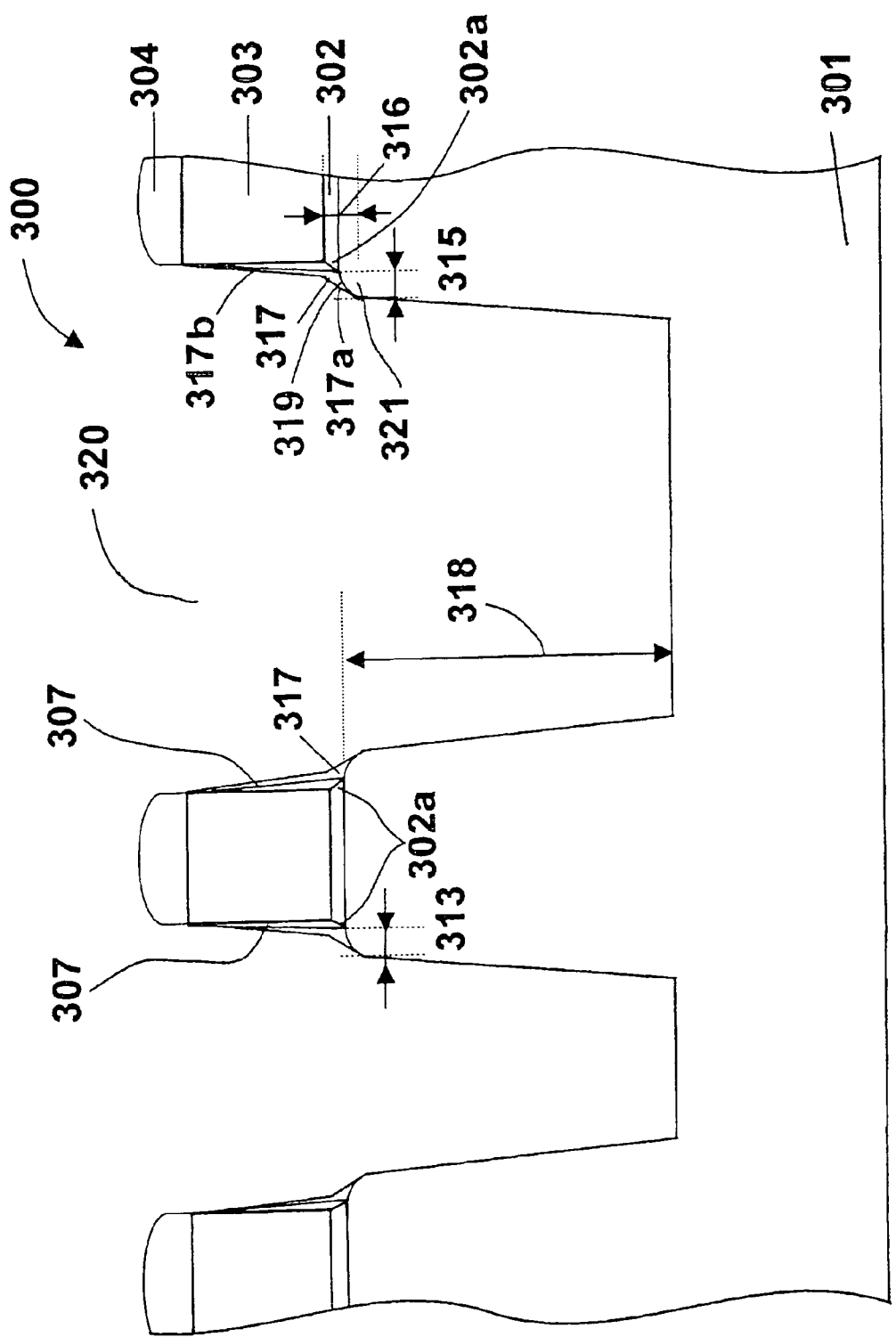
FIG. 16 is a schematic sectional view showing a manufacturing step of the semiconductor device according to the third embodiment.

In a step 5 shown in FIG. 16, the silicon substrate 301 is etched away until a set depth using the second removal preventing film 317 attached on the side walls of the resist pattern 304 and the opening 320 as a mask to form a trench 318. Furthermore, the upper end of the opening 120 is tapered.

In the step 5, a mixture gas of $Cl_2$ having a flow rate of 50 to 200 sccm and $O_2$ having a flow rate of 1 to 20 sccm is used as an etching gas, for example. The above etching steps are performed with the etching device for the silicon.

Figure 17A:
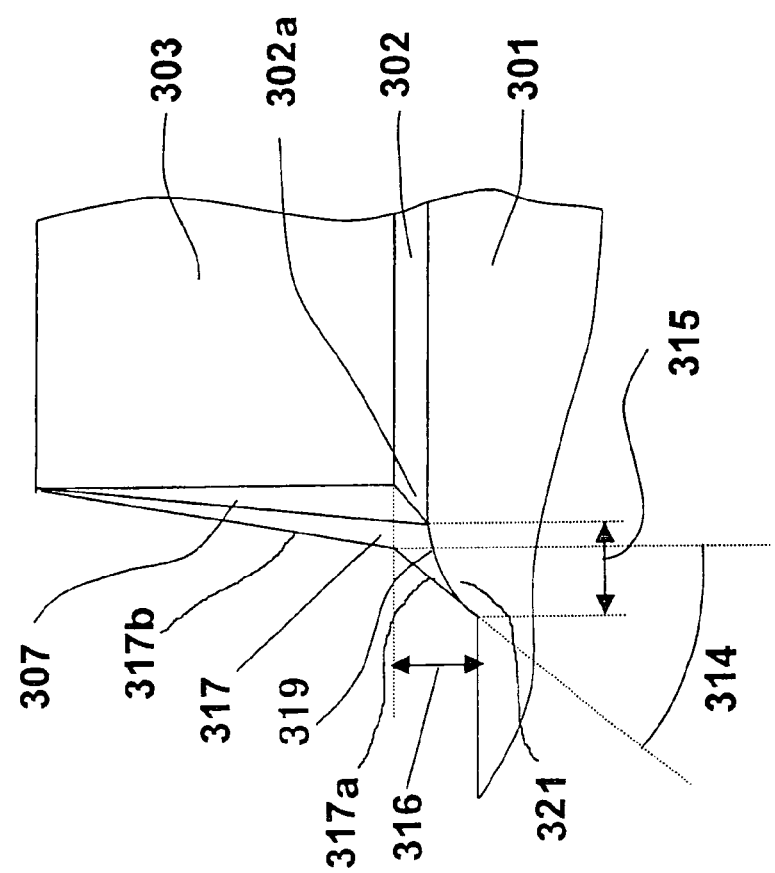
FIG. 17A is an enlarged view showing a silicon shoulder round part of the semiconductor device according to the third embodiment.
Figure 17B:
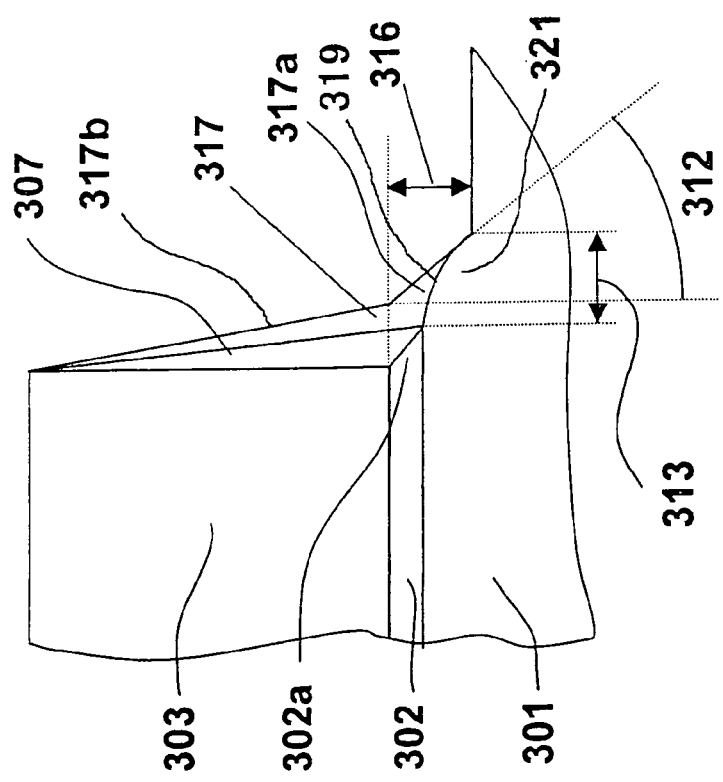
FIG. 17B is an enlarged view showing the silicon shoulder round part of the semiconductor device according to the third embodiment.

According to the manufacturing method of the semiconductor device having the above constitution, as shown in enlarged views showing the round part 319 in FIGS. 17A and 17B, at the portion in which the active regions are crowded (refer to FIG. 17A), since in the lower side than the projecting part 302a of the silicon oxide film 302, the taper angle 312 of the lower slanting portion 317a of the second removal preventing film 317 is changed more gently than the taper angle at the upper slanting portion 317b, the height of the second removal preventing film 317 that affects the projection amounts 313 and 315 and the round amount of the round part 319 becomes the height 316 of the lower slanting portion 317a. That is, in FIGS. 17A and 17B, the reference numeral 316 corresponds to the height and the reference numerals 313 and 315 correspond to the width and the reference numerals 312 and 314 correspond to the angle θ respectively in FIGS. 1 and 2.

As described above, according to this embodiment, since the projecting part 302a is formed at the lower end of the silicon nitride film 302, the height 316 of the removal preventing film 317 that affects the projection amounts 313 and 315 and the round amount of the round part 319 can be lowered as much as possible. Thus, variation of the projection amounts 313 and 315 and the round amount of the round part 319 can be prevented, and a dimensional difference (variation) in the active region width or the round shape after the trench etching on a wafer or between wafers can be prevented from being generated depending on a pattern density.

Fourth Embodiment

A fourth embodiment of the present invention will be described with reference to FIGS. 18 and 19. In addition, in FIGS. 18 and 19, the reference numeral 400 designates a chamber atmosphere, the reference numeral 401 designates a silicon substrate, the reference numeral 402 designates a silicon oxide film, the reference numeral 402a designates a projecting part of the silicon oxide film 402, the reference numeral 403 designates a silicon nitride film, the reference numeral 404 designates a resist pattern, the reference numeral 405 designates the thickness of the silicon oxide film, the reference numerals 409 and 411 designate projection amounts of the silicon oxide film 402, the reference numerals 412 and 414 designate the taper angles of a removal preventing film, the reference numerals 413 and 415 designate projection amounts of the silicon substrate, the reference numeral 416 designates the height of the removal preventing film, the reference numeral 417 designates the removal preventing film, the reference numeral 419 designates a round part, the reference numeral 420 designates an opening, the reference numeral 421 designates a projecting part of the silicon substrate 401.

Figure 13:
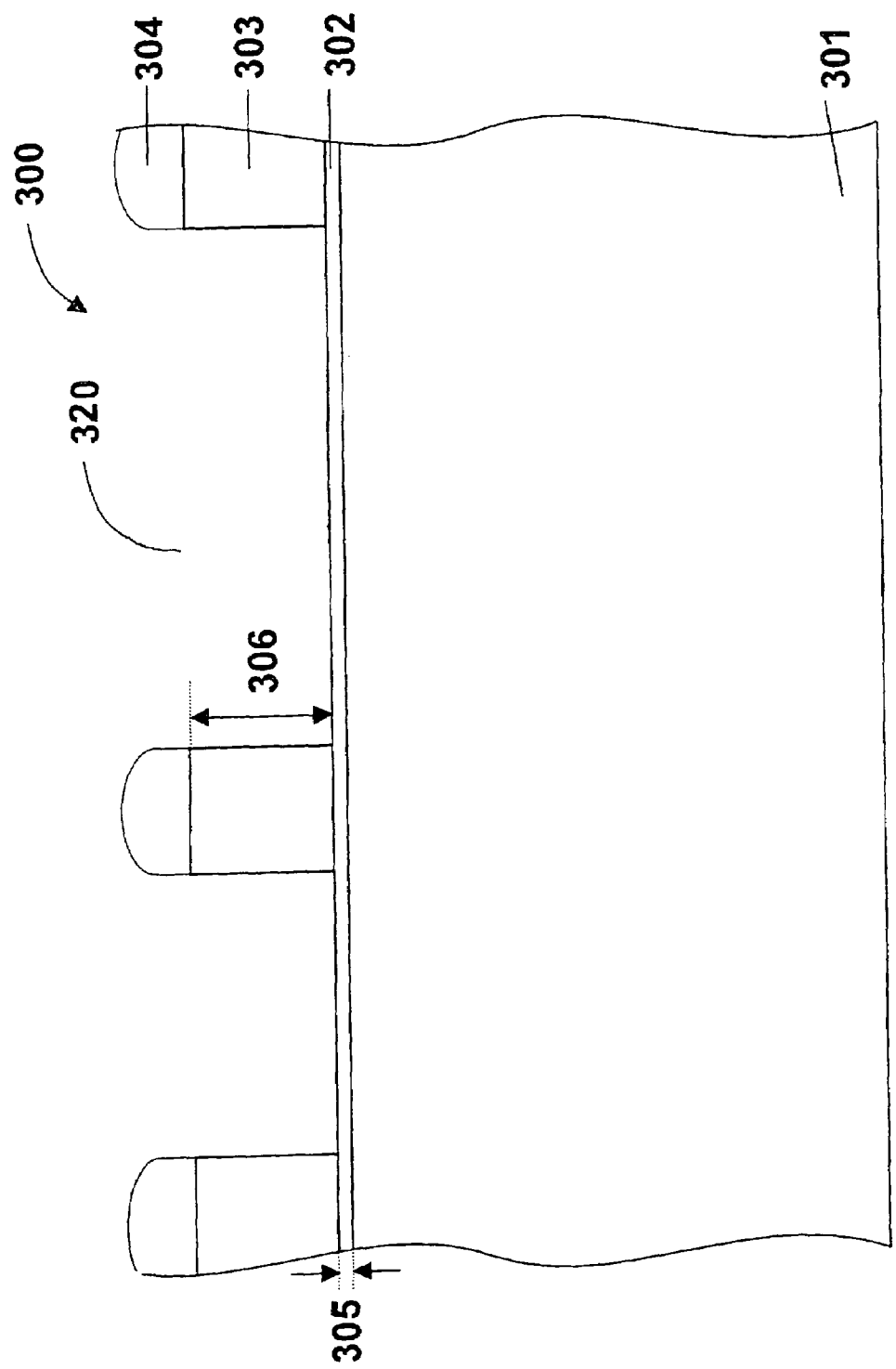
FIG. 13 is a schematic sectional view showing a manufacturing step of the semiconductor device according to the third embodiment.

Although the fourth embodiment provides a forming method different from that of the third embodiment, the same operations are performed as that in the third embodiment until the step 2 shown in FIG. 13, and in a step for etching silicon oxide film, namely, a step 3, etching is performed under the following condition.

That is, in the step 3 shown in FIG. 18, the condition in for etching the silicon oxide film 402 is made to be the one which isotropic etching can be performed on the silicon oxide film 402. In so doing, the projecting part 402a that projects from the side wall of the opening 420 toward the opening 420 remains on the silicon oxide film 402 through setting an etching condition as will be described below. At this time, the projection amounts 409 and 411 of the projecting part 402a to the opening 420 are controlled through adjusting the etching condition. In addition, it is preferable that the projection amounts 409 and 411 are smaller than the film thickness 405 of the silicon oxide film 402.

In the step 3, for example, in cas of an dry etching, one or a mixture of $CHF_3$ having a flow rate of 10 sccm to 50 sccm, $CF_4$ having a flow rate of 10 sccm to 50 sccm, $O_2$ having a flow rate of 5 sccm to 20 sccm, and Ar having a flow rate of 50 sccm to 500 sccm is used as an etching gas. In this case, it is preferable that $O_2$ flow rate is smaller or the value of $CHF_3$ gas flow rate/$CF_4$ gas flow rate is larger than that of the step 2. In addition, in the case of wet etching, isotropic etching is performed on the silicon oxide film 402 using a solution containing HF.

Figure 19:
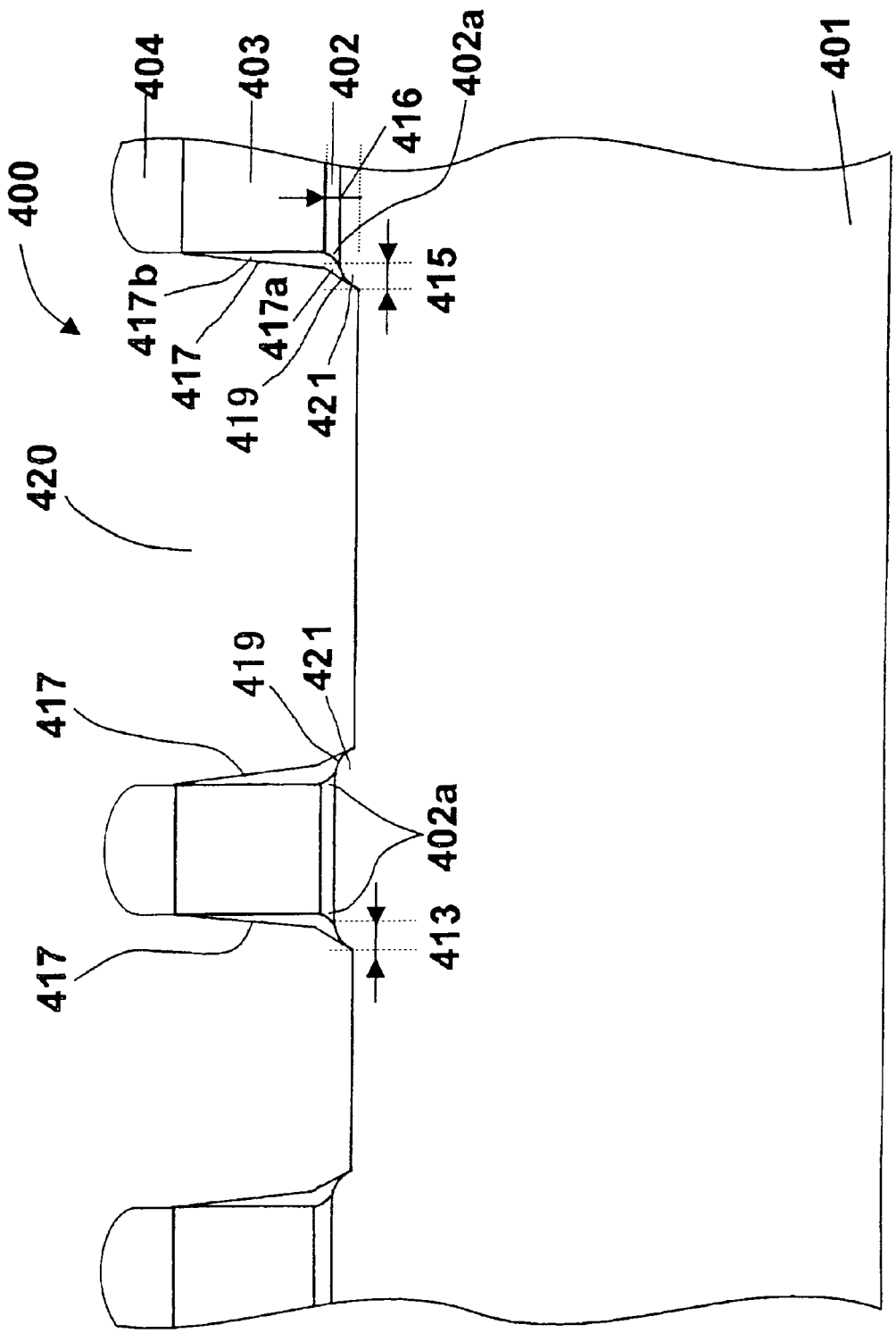
FIG. 19 is a schematic sectional view showing a manufacturing step of the semiconductor device according to the fourth embodiment.

Then, in the step 4 shown in FIG. 19, the surface of the silicon substrate 401 is etched away using the resist pattern 404 as an etching mask.

At this time,

The removal preventing film 417 is formed on the side wall of the opening 420.

The projecting part 421 of the silicon substrate 401 protruding from the side wall of the opening 420 toward the opening 420 remains.

The round part 419 is formed at the projecting part 421.

At this time, since the projecting part 402a is provided at the silicon oxide film 402, the removal preventing film 417 has a two-step slanting shape having a lower slanting portion 417a and an upper slanting portion 417b. The slanting angle of the lower slanting portion 417a is smaller than that of the upper slanting portion 417b. Furthermore, a height 416 of the lower slanting portion 417a constituting a part of the removal preventing film 417 is smaller than that of the whole removal preventing film 417 as a matter of course. The height 416 of the lower slanting portion 417a largely affects the projection amounts 413 and 415 of the projecting part 421 and the round shape of the round part 419 provided at the silicon substrate 401. Hence, by adjusting the height 416 (repressed to be small), the projection amounts 413 and 415 of the projecting part 421 and the round shape of the round part 419 can be adjusted. Thus, while the removal preventing film 417 is formed on the side wall of the silicon nitride film 403, the round part 419 at the trench upper shoulder part is formed with high accuracy through etching away the surface of the exposed silicon substrate 401.

In the step 4, the etching is performed using, for example, the etching gas containing hydrogen bromide (HBr) gas having a flow rate of 20 to 100 sccm so as to adjust the shape (projection amount and round amount) of the round part 419. In addition, the etching can be performed by further adding helium (He) to the etching gas. In this case, it is desirable that an power applied to a lower electrode is set in a range of 200 to 500 W.

In the subsequent steps, a component is formed in the same manner as the step 5 (FIG. 16) in the third embodiment.

Figure 20A:
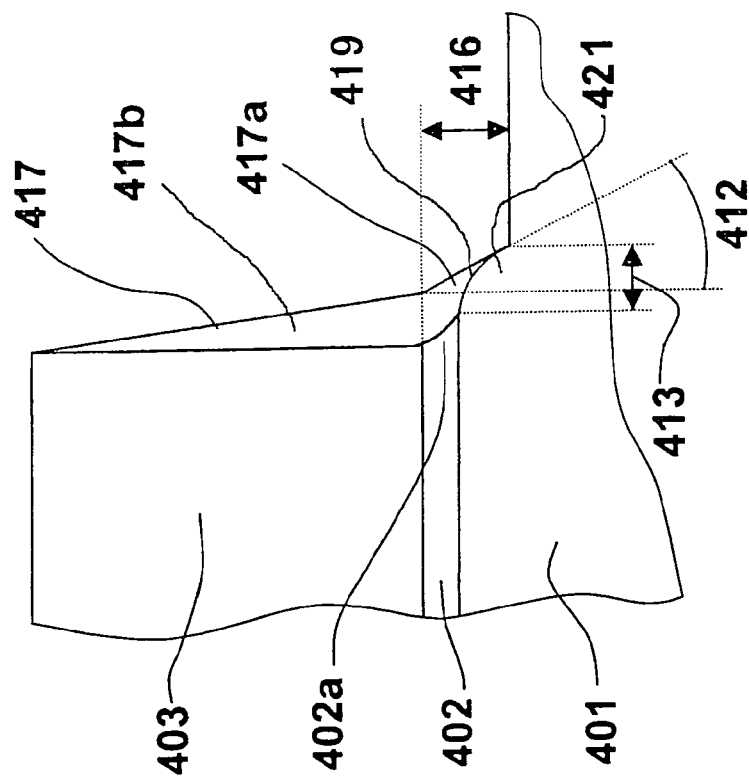
FIG. 20 is an enlarged view showing a silicon shoulder round part of the semiconductor device according to the fourth embodiment.
Figure 20B:
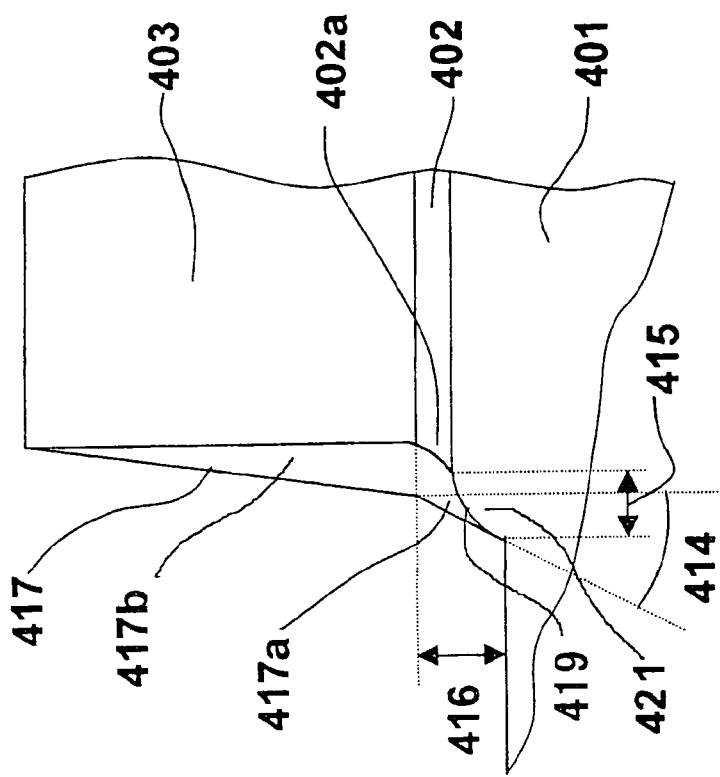
Figure 21:
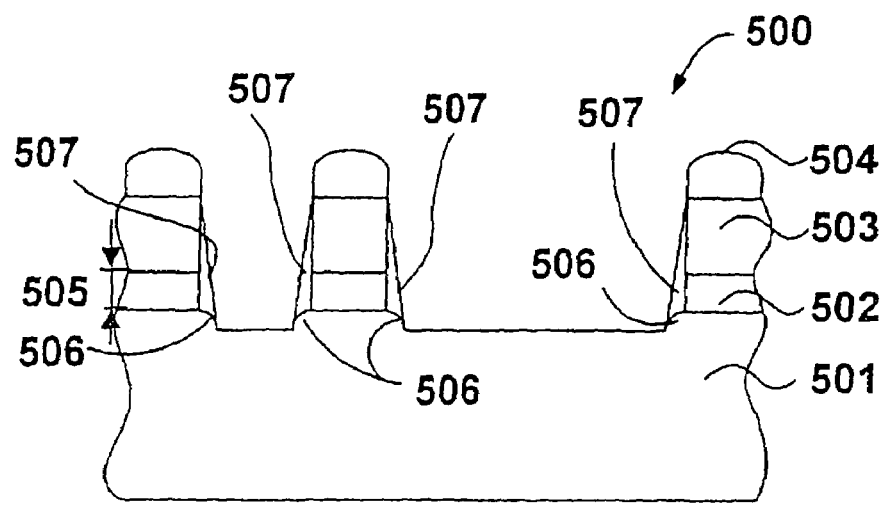
FIG. 21 is a schematic sectional view showing a shape after a trench shoulder part has been processed in a conventional step of manufacturing semiconductor.
Figure 22:
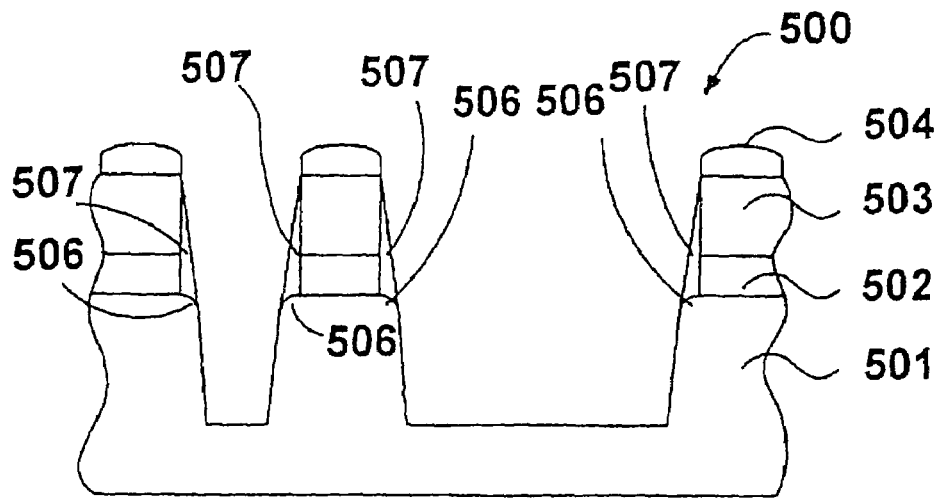
FIG. 22 is a schematic sectional view showing a shape after a trench formation has been completed in the conventional step of manufacturing semiconductor.
Figure 23:
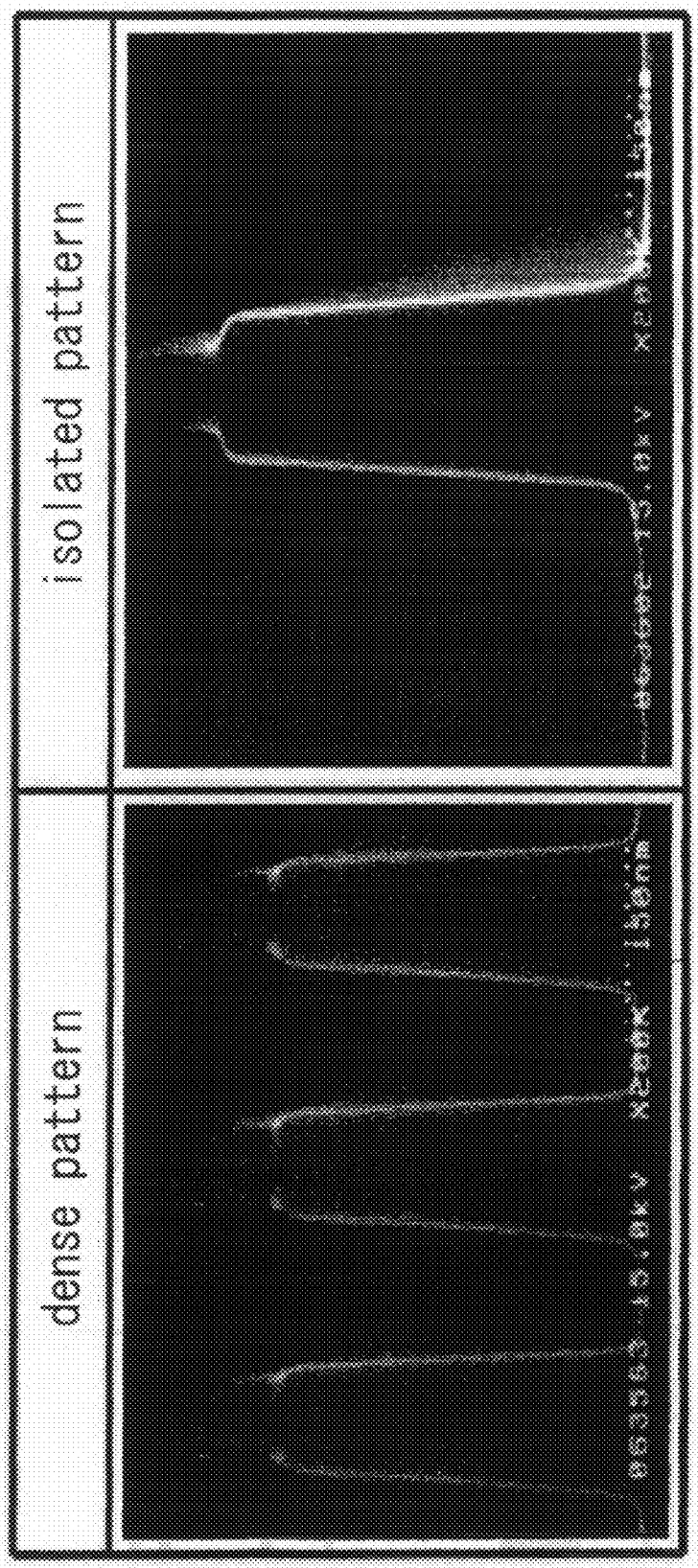
FIG. 23 is a representative sectional SEM image view after trench etching to explain a conventional problem.
Figure 24:
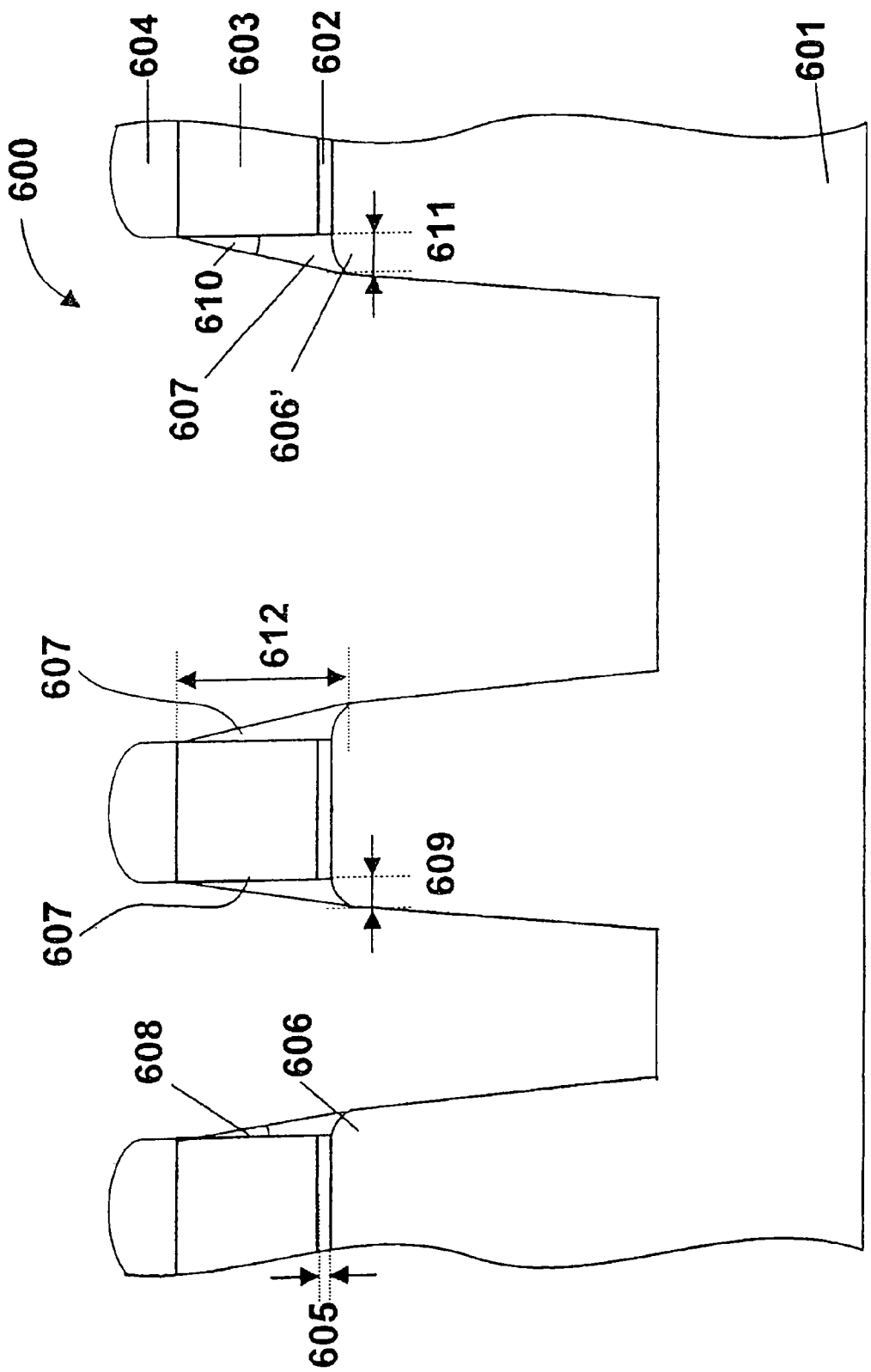
FIG. 24 is a schematic view showing a shape after trench etching to explain the conventional problem.

According to the manufacturing method of the semiconductor device having the above constitution, as shown in enlarged views showing the round part 419 in FIGS. 20A and 20B, at the part in which the active regions are crowded (refer to FIG. 20A), since the taper angle 412 of the lower slanting portion 417a of the removal preventing film 417 is changed more gently than the taper angle at the upper slanting portion 417b on the lower side of the projecting part 402a of the silicon oxide film 402, the height of the removal preventing film 417 that affects the projection amounts 413 and 415 and the round amount of the round part 419 becomes the height 416 at the lower slanting portion 417a. That is, in FIGS. 20A and 20B, the reference numeral 416 corresponds to the height and the reference numerals 413 and 415 correspond to the width and the reference numerals 412 and 414 correspond to the angle θ respectively in FIGS. 1 and 2.

Thus, according to this embodiment, since the projecting part 402a is formed at the lower end of the silicon nitride film 402, the height 416 of the removal preventing film 417 that affects the projection amounts 413 and 415 and the round amount of the round part 419 can be lowered as much as possible. Thus, the projection amounts 413 and 415 and the round amount of the round part 419 can be prevented from varying, and a dimensional difference (variation) in the active region width or the round shape after the trench etching on a wafer or between wafers can be prevented from being generated depending on a pattern density.

The present invention is advantageously applied to a semiconductor device having a trench isolation to reduce a dimensional difference on a wafer surface caused by a pattern density difference of an active region width.

Though the preferred embodiments of the present invention are explained in detail, it will be understood that various modifications may be made therein, and it is intended to cover in the appended claims all such modifications as fall within the true spirit and scope of the present invention.

What is claimed is:

1. A manufacturing method of a semiconductor device comprising:

forming a first film and a second film on a semiconductor substrate in this order;

forming a resist pattern on the second film;

forming an opening in the second film utilizing the resist pattern, a bottom portion of the second film remaining after forming the opening in the second film;

removing the bottom portion of the second film and forming a first removal preventing film on a side wall of the second film, a projecting part of the second film protruding from the side wall of the second film;

removing the first film exposed in the opening;

removing the surface of the semiconductor substrate exposed in the opening and forming a second removal preventing film on the first removal preventing film, a projecting round shaped part of the semiconductor substrate protruding into the opening; and removing the semiconductor substrate exposed in the opening.

2. The manufacturing method of the semiconductor device according to claim 1, wherein the first film is an oxide film, and the second film is a nitride film.

3. The manufacturing method of the semiconductor device according to claim 1, wherein the resist pattern is formed to have a shape that corresponds to a trench formed in the semiconductor substrate.

4. The manufacturing method of the semiconductor device according to claim 1, wherein the first film, the second film, the residual film and the semiconductor substrate are removed by etching treatment.

5. The manufacturing method of the semiconductor device according to claim 1, wherein the projecting part of the second film is tapered to have taper angle of 5° to 45° in the step of removing the residual film.

6. The manufacturing method of the semiconductor device according to claim 1, wherein the thickness of the residual film is formed to be 3 nm to 20 nm in the step of removing the second film at a state where the residual film remains at the bottom.

7. The manufacturing method of the semiconductor device according to claim 1, wherein a taper cutting of the upper end of the opening is carried out after the step of further removing the semiconductor substrate.

\* \* \* \* \*